(12) United States Patent
Koki et al.

(10) Patent No.: US 11,163,001 B2
(45) Date of Patent: Nov. 2, 2021

(54) REDUCTION OF SKEW BETWEEN POSITIVE AND NEGATIVE CONDUCTORS CARRYING A DIFFERENTIAL PAIR OF SIGNALS

(71) Applicant: Intel Corporation, Santa Clara, CA (US)

(72) Inventors: Tarakesava Reddy Koki, Bangalore (IN); Phani Kumar Alaparthi, Benguluru (IN)

(73) Assignee: Intel Corporation, Santa Clara, CA (US)

( * ) Notice: Subject to any disclaimer, the term of this patent is extended or adjusted under 35 U.S.C. 154(b) by 682 days.

(21) Appl. No.: 15/945,169

(22) Filed: Apr. 4, 2018

(65) Prior Publication Data

US 2019/0041458 A1   Feb. 7, 2019

(51) Int. Cl.
| | |
|---|---|
| G06K 5/04 | (2006.01) |
| G11B 5/00 | (2006.01) |
| G11B 20/20 | (2006.01) |
| G01R 31/317 | (2006.01) |
| H03K 5/01 | (2006.01) |
| H05K 1/02 | (2006.01) |
| H03K 5/00 | (2006.01) |

(52) U.S. Cl.
CPC ... *G01R 31/31725* (2013.01); *G01R 31/3171* (2013.01); *G01R 31/31706* (2013.01); *H03K 5/01* (2013.01); *H05K 1/0245* (2013.01); *H03K 2005/00026* (2013.01)

(58) Field of Classification Search
None
See application file for complete search history.

(56) References Cited

U.S. PATENT DOCUMENTS

| | | | |
|---|---|---|---|
| 10,684,123 B2 * | 6/2020 | Koul | H05K 3/00 |
| 2006/0244505 A1 * | 11/2006 | Fung | G06F 1/10 327/293 |
| 2009/0116844 A1 * | 5/2009 | Tanaka | H04B 10/677 398/115 |
| 2018/0083607 A1 * | 3/2018 | Kanomata | H04L 25/03885 |

* cited by examiner

*Primary Examiner* — Guerrier Merant
(74) *Attorney, Agent, or Firm* — Schwabe, Williamson & Wyatt, P.C.

(57) ABSTRACT

A processor includes a transmitter to transmit, to a receiver, a differential pair of signals including a positive signal transmitted across a positive conductor and a negative signal transmitted across a negative conductor. A first programmable analog delay circuit is coupled to the positive conductor to provide a first delay to the positive signal and a second programmable analog delay circuit is coupled to the negative conductor to provide a second delay to the negative signal. A controller receives data based on a bit error rate (BER) of the differential pair of signals as measured by a bit error checker of the receiver. In response to determining the BER is less than a threshold BER, the controller stores a first delay value to program the first delay and store a second delay value to program the second delay.

22 Claims, 10 Drawing Sheets

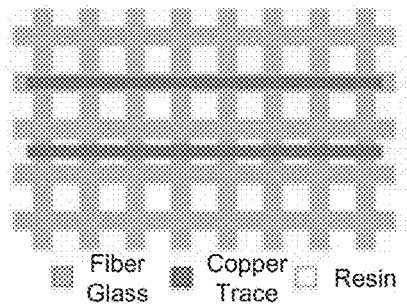
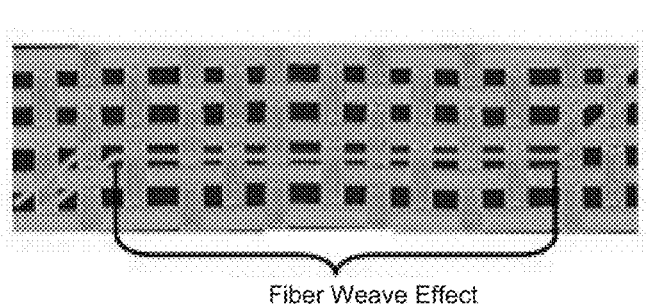
FIG. 4A　　　　　　　FIG. 4B
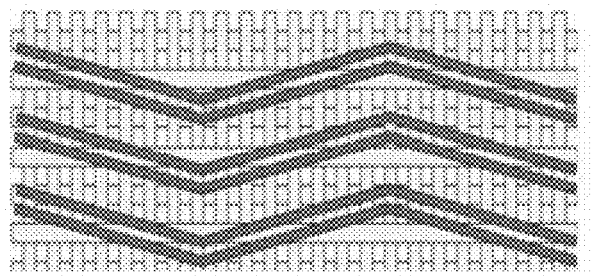
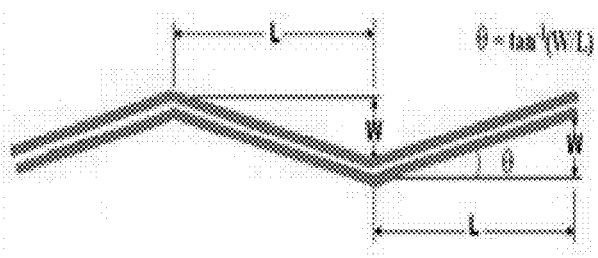
FIG. 4C
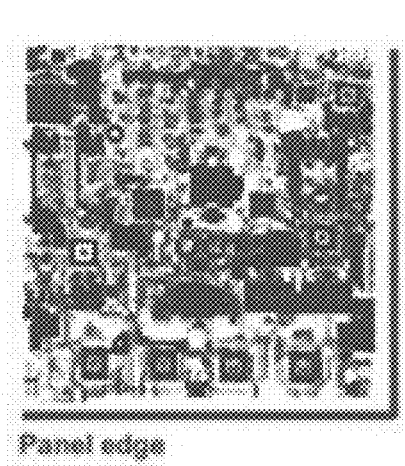
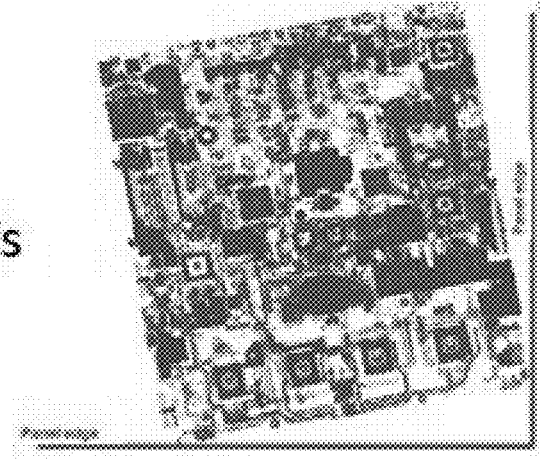
FIG. 5

REDUCTION OF SKEW BETWEEN POSITIVE AND NEGATIVE CONDUCTORS CARRYING A DIFFERENTIAL PAIR OF SIGNALS

BRIEF DESCRIPTION OF THE DRAWINGS

FIGS. 4A and 4B are microscopic top views of a tightly coupled differential conductors over a printed circuit board (PCB), which creates a fiber weave effect (FWE) according to one embodiment.

FIG. 4C is an image of zig-zag traces on a PCB, which are implemented in an attempt to reduce FWE referenced in FIGS. 4A and 4B.

FIG. 5 is a pair of images illustrating rotation of a PCB to attempt to mitigate fiber weave effect (FWE) according to an embodiment.

DESCRIPTION OF EMBODIMENTS

Figure 1A:
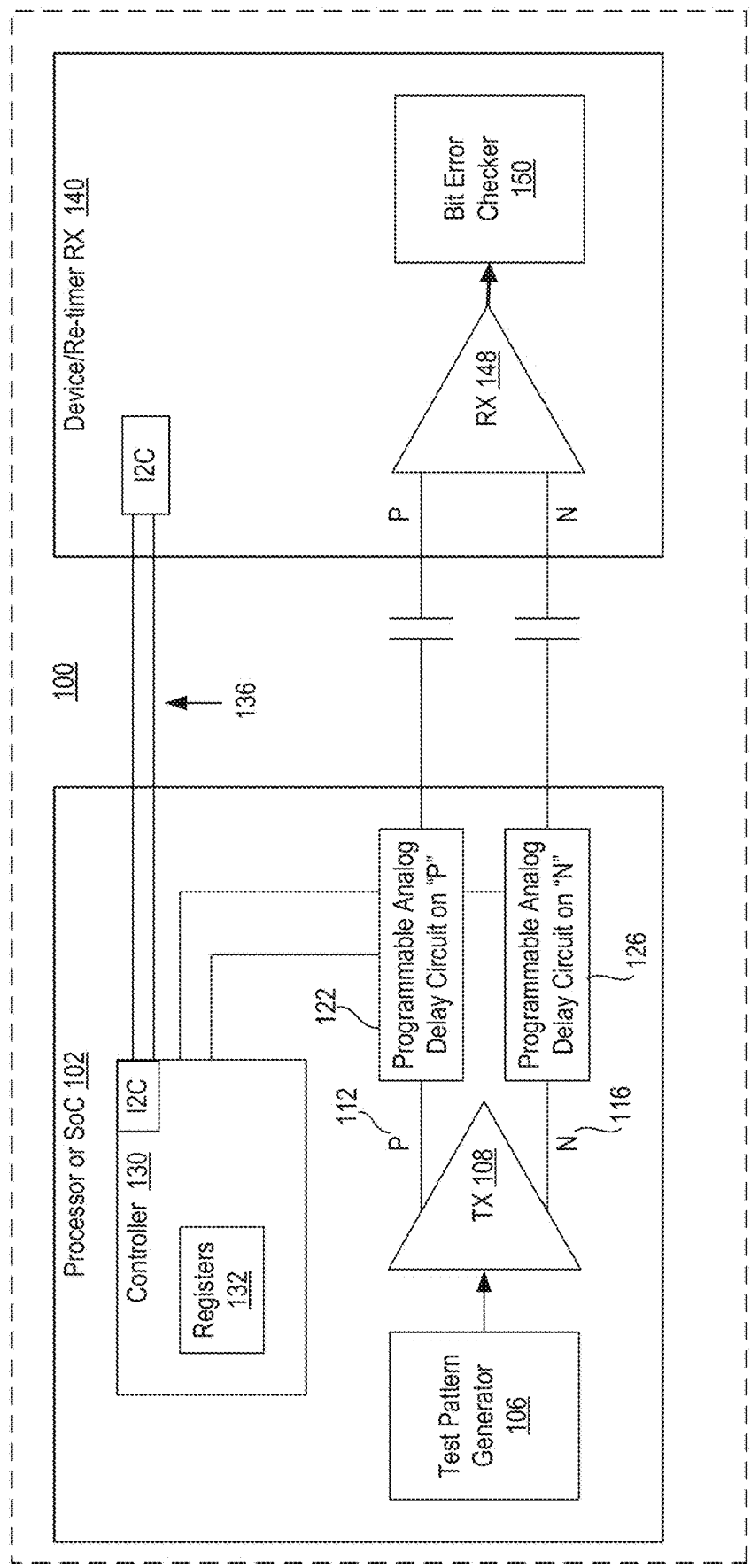
FIG. 1A is a block diagram of a system including a transmitter and receiver that sends and receives, respectively, differential pairs of signals according to an embodiment.

As lane speeds increase in printed circuit boards (PCBs), routing high-speed signals over metal traces grows more challenging. Today, much of circuit design time is spent on routing the differential pairs of signals that have tight skew requirements between positive and negative signals, e.g., between plus and minus three picoseconds (ps) for example. Designers may use computer aided design (CAD) tools to attempt to perform through-routing with such tight skews. Due to the fiber weave effect (FWE) on PCBs, larger timing skews may still be observed due to PCB dielectric laminate construction on the actual PCB between positive and negative signals of a differential pair of signals. As the timing skew between the positive and negative signals increases, large skews may result in the loss of data.

FIGS. 4A and 4B are a microscopic top view of a tightly coupled differential conductor over a PCB, which creates a fiber weave effect (FWE) according to one embodiment. Dielectric materials of PCBs are usually woven fiberglass fabrics that are reinforced with epoxy resin. As fabric fiber and resin are composite materials with different dielectric constants and loss tangent properties, the weave patterns of fiberglass bundles cause PCB-based substrates to be electrically inhomogeneous.

As data rates increase, designers are increasingly moving away from wide parallel buses to serial buses with differential signaling. In high-speed differential signaling, any timing skew between the positive (D+) and negative (D−) data signals may convert some of the differential pair of signals into a common signal component. Ultimately, this timing skew may result in eye closure at the receiver and may contribute to electro-magnetic interference (EMI) radiation. Ideally, routing of a differential pair of signals on a PCB would result in the two traces looking the same from an electrical standpoint and the timing skew (time delay) between the two traces of the differential pair should be zero. Due to FWE, however, achieving the ideal is not realistic.

With continued reference to FIGS. 4A and 4B, a differential pair routing is illustrated where one trace is routed over a fiberglass bundle for a portion of its length while the other trace is routed over mostly resin. Hence, it may not be possible to achieve perfectly balanced differential lines in realized designs. This is known as timings or phase skew leading to reduced bit-error-rate (BER) performance and increased EMI radiation, which may have profound impacts on the effective dielectric constants of PCB, causing unforeseen degradations in signal integrity.

In most of the cases the data show it is unreasonable to expect skew variations below one picosecond-per-inch in trace constructions with epoxy or fiberglass laminates, even with the most aggressive diagonal routing approaches. In one such example the measured phase difference between the two signals at the receiver for a 6 GHz PCB trace is 105 ps after matching the positive and negative signals of a differential pair in the PCB within plus or minus three picoseconds. Industry research indicates that the skew bound can easily be +/−7.5 to +/−10 ps/inch. The worst case is far more severe and presents interesting challenges to the development of high-data-rate-signaling systems.

Taking Thunderbolt™ (TBT) as an example for PCB FWE, Thunderbolt™ is integrated into a system-on-a-chip (SoC) and runs at speeds of 20 gigabit-per-second (gbps) and at 30 gbps to be supported in the future. These signals are victims for FWE due to the PCB layer construction of long horizontal or vertical traces. In order to compensate for the PCB losses, designers may add a redriver or retimer (e.g., a device placed in the middle of a channel to compensate for channel loss) between the SoC and a Universal Serial Bus (USB) Type-C Connector. But, such a redriver or retimer does not solve the positive and negative signal mismatch due to FWE. While Thunderbolt™ is referenced as an example, other high speed interfaces are impacted by FWE include, for example, High Definition Multimedia Interface (HDMI), DisplayPort (DP), Embedded DisplayPort (eDP), USB3, Peripheral Interconnect Component Express (PCIe), Universal Flash Storage (UFS) interface, Serial Gigabit Media Independent Interface (SGMII), MIPI Display Serial Interface (DSI), MIPI Camera Serial Interface (CSI), Integrated Connectivity (CNVi), Serial Advanced Technology Attachment (SATA), Serial Rapid Input Output (SRIO), Ultra High Definition (UHS-II), Direct Media Interface (DMI), Mobile High-Definition Link (MHL), and the like.

FIG. 4C is an image of zig-zag traces on a PCB, which are implemented in an attempt to reduce FWE referenced in FIGS. 4A and 4B. Zig-zag traces were intended to compensate for the fiber weave effect, because the traces are routed on and off weave repeatedly. Use of the zig-zag approach may increase PCB real estate. It would also be difficult to follow for all the differential pair of signals as signals may run all over the board. In actual PCBs, there are ample circumstances that cause skew, even after taking care in the layout by routing the differential pairs in a zig-zag pattern.

FIG. 5 is a pair of images illustrating rotation of a PCB to attempt to mitigate fiber weave effect according to an embodiment. A board manufacturer may rotate the PCB on the board panel or a designer may rotate the board file in CAM or CAD tools to mitigate the FWE. Panel rotation may indirectly increase the board real estate by causing material wastage in the unused triangular areas. Rotation may also have to be spelled out very clearly and unambiguously, including large notes on fab drawings and may call for a detailed discussion with a fabrication house on the panel rotation requirement and degree of rotation.

Accordingly, skew from FWE in differential signals on PCBs may be reduced by way of determining a bit error rate (BER) between the positive and negative signals after transmission, e.g., via receipt of the BER from a receiver of a differential pair of signals. Control circuitry may adjust delay on one of a positive conductor (e.g., to adjust a first net delay on the positive conductor) or a negative conductor (e.g., to adjust a second net delay on the negative conductor) of differential traces such as to reduce the BER below a threshold BER, e.g., 1, 2, 3, or other small number of picoseconds.

More specifically, in one embodiment, a first programmable analog delay circuit may be coupled to the positive conductor to provide the first delay to the positive signal. A second programmable analog delay circuit may be coupled to the negative conductor to provide a second delay to the negative signal. In various embodiments, the programmable analog delay circuits may be line delay circuits such as tapped delay lines. A controller may be coupled to the first programmable analog delay circuit and to the second programmable analog delay circuit. The controller may receive, over a transmission link with the receiver, the BER of the differential pair of signals as measured by a bit error checker of the receiver. In response to a determination that the BER is less than or equal to a threshold BER, the controller may store a first delay value to program the first delay of the first programmable analog delay circuit and store a second delay value to program the second delay of the second programmable analog delay circuit.

In various embodiments, if the BER is greater than the threshold BER, the controller may adjust the first delay value with respect to the second delay value or the second delay value with respect to the first delay value, to generate a first net delay value and a second net delay value, and then recheck the BER. The controller may continually adjust at least one of the first or second net delay value until the BER drops below the threshold BER, at which point the controller may store the first and second net delay values, e.g., in registers, to program first and second programmable analog delay circuits, respectively, for continued operation with reduced skew.

FIG. 1A is a block diagram of a system 100 including a transmitter and receiver that sends and receives, respectively, a differential pair of signals according to an embodiment. In various embodiment, the system 100 may include a processor 102 (or system on a chip (SoC)), a device receiver 140, and an inter IC (I2C) bus 136 or other type of inter-chip bus. In one embodiment, the processor 102, the device receiver 140, and the I2C bus 136 may be integrated into a single physical system (denoted with dashed line). In different embodiments, the processor 102 is a Field Programmable Gate Array (FPGA), a microcontroller, embedded controller, or other programmable controller.

In various embodiments, the processor 102 includes a test pattern generator 106 coupled to a transmitter 108, which transmits a differential pair of signals having a positive signal and a negative signal over a differential line that includes a positive conductor 112 and a negative conductor 116. The processor 102 may further include a first programmable analog delay circuit 122 coupled to the positive conductor 112 and a second programmable analog delay circuit 126 coupled to the negative conductor 116. The processor 102 may further include a controller 130 having registers 132 in which to store delay values (or net delay values) for the first and second programmable analog delay circuits 122 and 126. In one embodiment, the device receiver 140 may include a receiver 148 coupled to a bit error checker 150. The device receiver 140 may communicate with the controller 130 of the processor 102 via a transmission link over the I2C bus 136 or other type of communication protocol bus.

In various embodiments, the test pattern generator 106 may generate a test bit pattern for transmission within the differential pair of signals. The test bit pattern may be known to the bit error checker 150. In one embodiment, the test bit pattern may be a pseudorandom binary sequence (PRBS), e.g., a binary sequence that, while generated with a deterministic algorithm, may be difficult to predict and exhibit statistical behavior similar to a truly random sequence. The bit error checker 150 may compare a received test bit pattern with a known test bit pattern (e.g., PRBS), and calculate a bit error rate (BER) based on the comparison. The bit error checker 150 may then transmit, over the transmission link, the BER to the controller 130, e.g., in a header of an I2C packet over the I2C bus 136.

In the various embodiments, the transmitter 108 may transmit, to the receiver 148, the differential pair of signals (carrying the test bit pattern) that includes a positive signal transmitted across the positive conductor 112 and a negative signal transmitted across the negative conductor 116. The first programmable analog delay circuit 122 may be coupled to the positive conductor 112 to provide a first delay to the positive signal. The second programmable analog delay circuit 126 may be coupled to the negative conductor 116 to provide a second delay to the negative signal. The controller 130 may thus be configured to program delay values into the first and second programmable analog delay circuits 122 and 126, and may store these delay values in the registers 132 to fix the delay values for continued use, even after reset of the system 100. The controller 130 may receive, over the transmission link 136 from the device 140, the BER of the differential pair of signals as measured by the bit error checker 150 of the device receiver 140.

More specifically, the controller 130 may, in response to a determination that the BER is less than or equal to a threshold BER, store a first delay value (or first net delay value) to program the first delay of the first programmable analog delay circuit 122 and store a second delay value (or second net delay value) to program the second delay of the second programmable analog delay circuit 126. The first delay value may be stored in a first register and the second delay value may be stored in a second register of the registers 132, so that these values may be continually used to control the first delay and the second delay. In this way, the first and second programmable analog delay circuits 122 and 126 are programmed with a first delay value and a second delay value, respectively, which together generate a favorable BER and thus reduce skew between the positive and negative signals of the differential pair of signals.

As will be discussed in more detail with reference to FIG. 3, if the BER is greater than the threshold BER, the controller 130 may adjust the first delay value with respect to the second delay value (to generate a first net delay value) or the second delay value with respect to the first delay value (to generate a second net delay value). The controller 130 may then recheck the BER against the threshold BER using a first net delay value and a second net delay value. The adjustment may be made by adding a fixed delay value (e.g., 2, 3, 4, or more picoseconds) to a net delay value in various embodiments. In other embodiments, the fixed delay value may be subtracted from the net delay value. The controller 130 may continually adjust at least one of the first net delay value or second net delay value until the BER drops below the threshold below. Once the BER is below the threshold BER, the controller 130 may store the first and second net delay values, e.g., in the registers 132, to program first and second programmable analog delay circuits, respectively, for continued operation with reduced skew.

In various embodiments, the first programmable analog delay circuit 122 is a first tapped delay line and the second programmable analog delay circuit 126 is a second tapped delay line. Furthermore, to store the first delay value may include to store a tap value for the first tapped delay line of the first programmable analog delay circuit that generates the first delay. And, to store the second delay value may include to store a tap value for the second tapped delay line of the second programmable analog delay circuit that generates the second delay. These tap values may be analog tap values obtained after testing on an actual PCB under process voltage temperature (PVT) conditions.

Tapped delay lines are used to insert a very precise delay into the path of a signal. A wide variety of delay lines are available. Some produce a fixed delay, often with multiple tap points, while others produce a delay that may be adjusted by an analog voltage or digital control word. Adjustable delay lines may be a component of certain clock synchronization circuits such as a delay locked loop (DLL), phase lock loop (PLL), or a synchronous mirror delay (SMD). The performance of an adjustable delay line is usually defined by linearity, which describes how precisely the delay tracks the control signal.

In one embodiment, each tapped delay line may be a digitally tapped-delay line (TDL) used to move, delay, and store data at precise time windows for data synchronization purposes. Moreover, complementary metal-oxide semiconductor (CMOS) delay lines may be used in applications of clock distribution and clock-data recovery (CDR) to satisfy the growing needs for precise clock deskew, and in accurate pulse-edge placement control for testing and debugging the dynamic behavior of high-speed and high-performance digital very-large-scale integration (VLSI) circuits. Such CMOS delay lines may also be used in on-chip time measurements and the synchronization of a CPU with its interfaces.

Figure 1B:
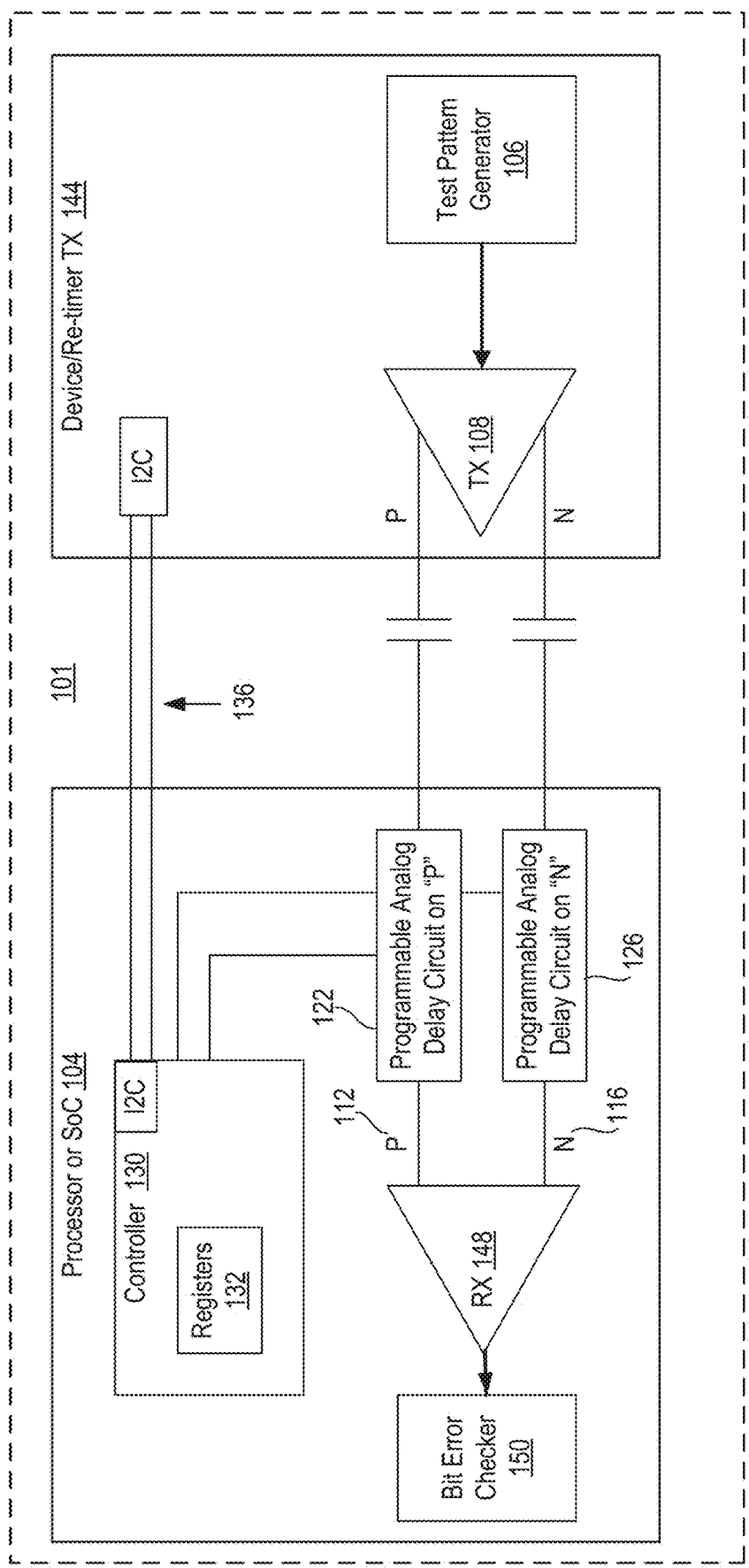
FIG. 1B is a block diagram of a system including a transmitter and receiver that sends and receives, respectively, differential pairs of signals according to another embodiment.

FIG. 1B is a block diagram of a system 101 including a transmitter and receiver that sends and receives, respectively, differential pairs of signals according to another embodiment. The system 101 of FIG. 1B is similar in some respects to the system 100 of FIG. 1A, and the components that are the same will not be described in detail. The system 101 of FIG. 1B may include a processor 104 (or SoC) similar to the processor 102 of FIG. 1A, but that contains the receiver 148 and the bit error checker 150. The system 101 further includes a device (e.g., re-timer) transmitter 144 that includes the transmitter 108 and the test pattern generator 106 that were located in the processor 102 of the system 100 of FIG. 1A.

In the embodiment of FIG. 1B, the device transmitter 144 is now the component generating the differential pair of signals that carry the test bit pattern. For example, the test pattern generator 106 may generate the test bit pattern for the transmitter 108 to transmit in a differential pair of signals over the positive conductor 112 and the negative conductor 116 of the differential pair of conductors. The processor 104 may then receive the differential pair of signals with the receiver 148, after delay applied by the first and second programmable analog delay circuits 122 and 126. As in the system 100 of FIG. 1A, the controller 130 may be configured to program delay values into the first and second programmable analog delay circuits 122 and 126 based on the BER, which may be received directly from bit error checker 150 that is now located within the processor 104. The controller 130 may store these delay values (or net delay values) in the registers 132 to fix the delay values for continued use, even after reset of the system 101.

Figure 2:
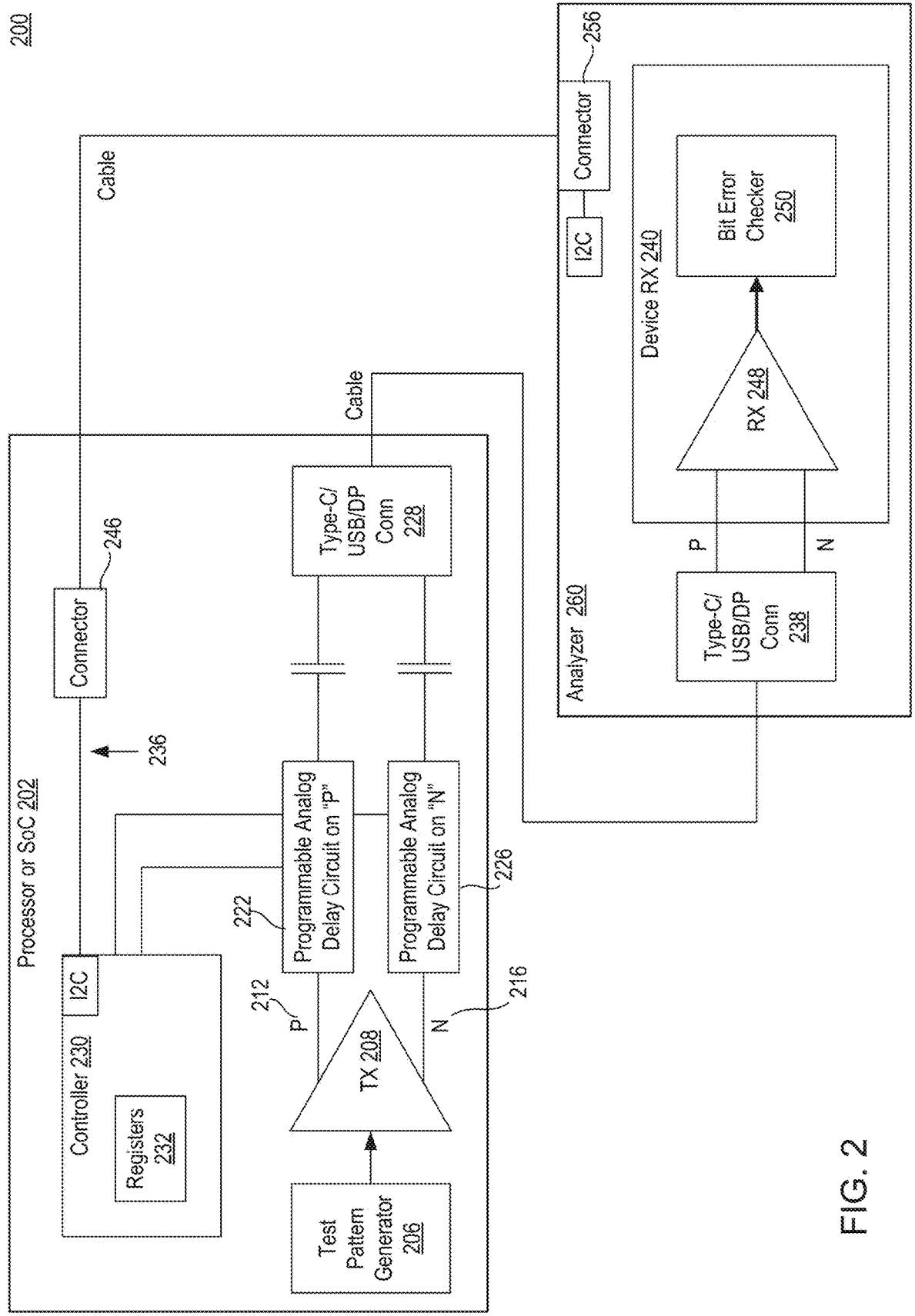
FIG. 2 is a block diagram of a system including a transmitter that transmits differential pairs of signals and external analyzer having a receiver that receives the differential pairs of signals according to an embodiment.

FIG. 2 is a block diagram of a system 200 including a transmitter 208 that transmits a differential pair of signals and external analyzer 260 having a receiver 248 that receives the differential signals according to an embodiment. The system 200 of FIG. 2 is similar to the system 100 of FIG. 1A in some respects and different in other respects. Little additional explanation is provided for component or aspects that are similar to those discussed with reference to the system 100 of FIG. 1A. The system 200 may include a processor 202 (or SoC) and an analyzer 260. In one embodiment, the analyzer 260 and the processor 202 are combined into a single system. In another embodiment, the analyzer 260 is an external device that is coupled to the processor 202 for purposes of testing and programming, e.g., in order to program positive and negative delay values within the processor 202 after the processor 202 has been manufactured.

In various embodiments, the processor 202 (or an SoC) includes a test pattern generator 206 coupled to a transmitter 208, which transmits a differential pair of signals having a positive signal and a negative signal over a differential line that includes a positive conductor 212 and a negative conductor 216. The processor 202 may further include a first programmable analog delay circuit 222 coupled to the positive conductor 212, to generate a first delay to the positive signal, and a second programmable analog delay circuit 226 coupled to the negative conductor 216 to generate a second delay to the negative signal. Each of the first programmable analog delay circuit 222 and the second programmable analog delay circuit 226 may be coupled to a connector 228 (e.g., USB Type-C), display port (DP), or other type of connector. The processor 202 may further include a controller 230 having registers 232 in which to store delay values, corresponding to the first delay and the second delay, for the first and second programmable analog delay circuits 222 and 226.

The controller 230 may be coupled to a connector 246, e.g., through an inter IC (I2C) bus 236. The I2C protocol is exemplary, and other communication technologies may include, but not be limited to, MIPI's I3C$^{SM}$, Universal Asynchronous Receiver-Transmitter (UART), serial peripheral interface (SPI), System Management Bus (SMbus), Controller Area Network (CAN), Local Area Network (LAN), Universal Serial Bus 2 (USB2), Auxiliary Port (AUX), Digital Data Control (DDC), and the like.

In various embodiments, the analyzer 260 may include connector 238 (e.g., for compatible connection to the connector 228), a device receiver 240 and a connector 256. The device receiver 240 may include a receiver 248, configured to receive the differential pair of signals, and a bit error checker 250. The connector 246 of the processor 202 may be compatible with and configured to connect to the connector 256 of the analyzer 260. Furthermore, the connector 238 of the analyzer 260 may be connected to the connector 228 of the processor 202 via an external cable, e.g., a USB cable, TBT cable, a HDMI cable, display port cable, or other high speed interconnect cable. The connector 238 may be coupled to the receiver 248 with a differential pair of conductors. In various embodiments, the components of the system 100 that have corresponding components in the system 100 of FIG. 1A may function similarly as described with reference to FIG. 1A.

Figure 3:
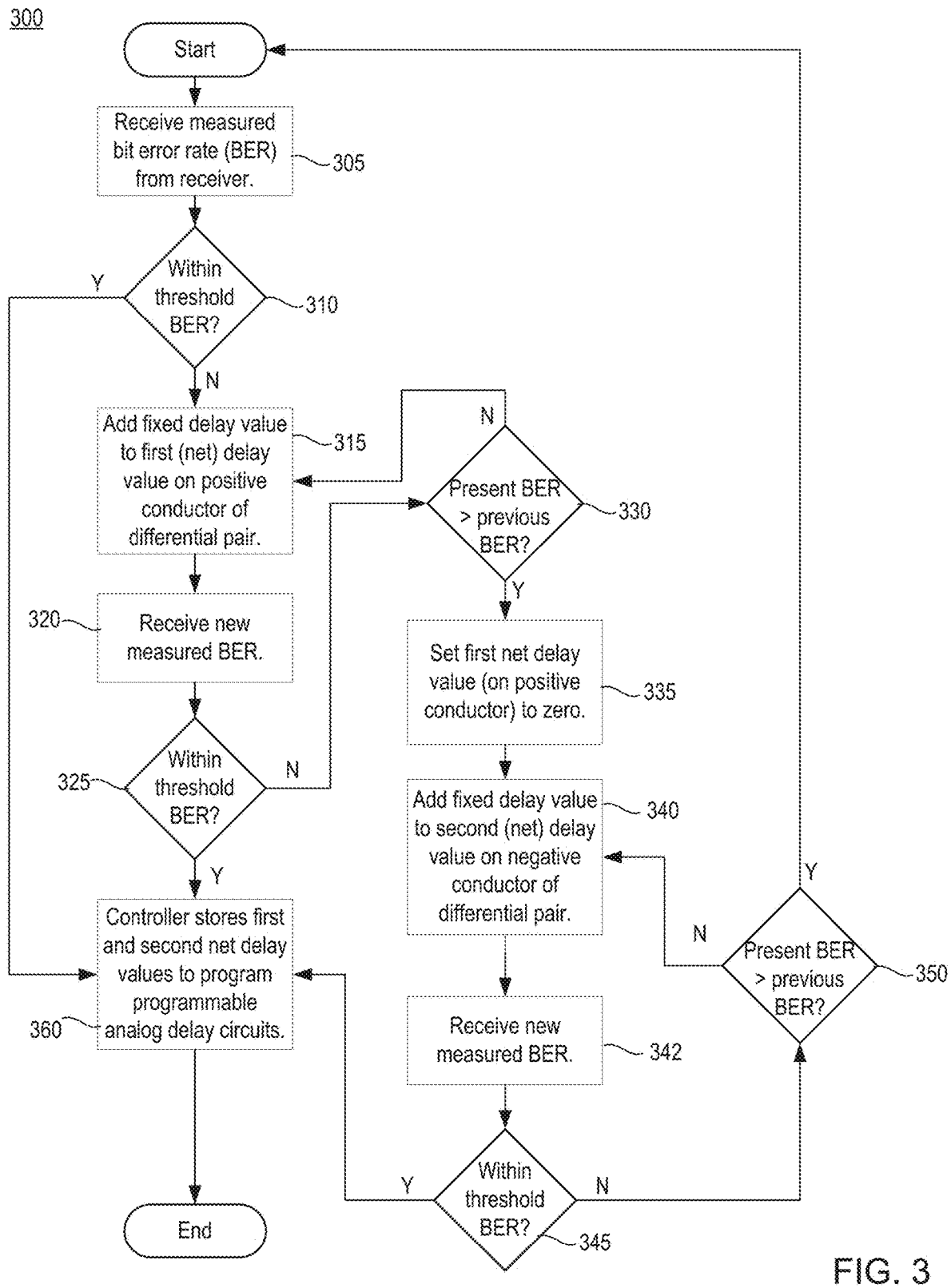
FIG. 3 is a flow chart of a method for reducing skew between positive and negative conductors carrying a differential pair of signals according to one embodiment.

FIG. 3 is a flow chart of a method 300 for reducing skew between positive and negative conductors carrying a differential pair of signals according to one embodiment. The method 300 may be performed by processing logic that may comprise hardware (e.g., circuitry, dedicated logic, programmable logic, microcode, etc.), software (such as instructions run on a processing device), firmware, or a combination thereof. In one implementation, the processor 102 (or SoC) and/or the controller 130 in FIGS. 1A and 1B may perform method 300. Although shown in a particular sequence or order, unless otherwise specified, the order of the processes can be modified. Thus, the illustrated embodiments should be understood only as examples, and the illustrated processes can be performed in a different order, and some processes may be performed in parallel. Additionally, one or more processes can be omitted in various embodiments. Thus, not all processes are required in every embodiment. Other process flows are possible.

With further reference to FIG. 3, the method 300 may begin with the processing logic receiving a measured bit error rate (BER), e.g., measured by the bit error checker 150 of the device receiver 140 (305). The method 300 may continue with the processing logic determining whether the measured BER is less than or equal to a threshold BER (310). If yes, the method 300 may continue with the processing logic storing a first delay value (e.g., in a register) to program the first delay of the first programmable analog delay circuit 122 and store a second delay value (e.g., in a second register) to program the second delay of the second programmable analog delay circuit 126 (360). If no, the method 300 may continue with the processing logic adding a fixed delay value (e.g., 0.5 ps, 1 ps, 2 ps, or the like) to the first delay value to generate a first net delay value (315). In other embodiments, the fixed delay value may be subtracted from the first net delay value. The method 300 may continue with the processing logic receiving a new measured BER based on the use of the first net delay value (320).

With continued reference to FIG. 3, the method 300 may continue with the processing logic again determining with the BER (the new measured BER) received from the receiver is less than or equal to the threshold BER (325). If yes, the method 300 may continue with the processing logic storing a first delay value (e.g., in a register) to program the first delay of the first programmable analog delay circuit 122 and store a second delay value (e.g., in a second register) to program the second delay of the second programmable analog delay circuit 126 (360). If no, the method 300 may continue with the processing logic determining whether the present BER is greater than the previous BER (330). If no, the method 300 may continue with the processing logic repeating the addition of a fixed delay value to the first net delay value, to generate an updated first net delay value (315). In other embodiments, the fixed delay value may be subtracted from the first net delay value. If yes, the method 300 may continue with the processing logic setting the first net delay value to zero (335). This reset may reinitialize the first net delay value, based on guessing wrong that the skew was due to delay on the negative conductor 116.

With continued reference to FIG. 3, the method 300 may continue with the processing logic adding the fixed delay value to the second delay value to generate a second net delay value (340). Of course, the adding of the fixed delay value to the second delay value (or subtracting the fixed delay value therefrom) may happen first at block 315 such that the setting of the second net delay value to zero may occur at block 335 and the action taken in block 315 may be taken at block 340. In this way, it does not matter whether the method 300 begins with adjusting the first delay value or the second delay value because blocks 340, 342, 345, and 350 may be swapped with blocks 315, 320, 325, and 330, respectively. The method 300 may continue with the processing logic receiving a new measure BER based on use of the second net delay value (342).

The method 300 may continue with the processing logic again determining whether the BER (the new BER based on changes to the first and second net delay values) is less than or equal to the threshold BER (345). If yes, the method 300 may continue with the processing logic storing a first delay value (e.g., in a register) to program the first delay of the first programmable analog delay circuit 122 and store a second delay value (e.g., in a second register) to program the second delay of the second programmable analog delay circuit 126 (360). If no, the method 300 may continue with the processing logic determining whether the present BER is greater than the previous BER (350). If yes, the method 300 may restart. If no, the method 300 may continue with the processing logic again adding the fixed delay value to the second net delay value on the negative conductor to update the second net delay value (340). And as mentioned, in other embodiments, the fixed delay value may be subtracted from the second net delay value instead of being added to it.

In various embodiments, the adding of the fixed delay to either the first delay value (or first net delay value) in block 315 or the second delay value (or second net delay value) in block 340 may be repeated a number of times until the present BER becomes less than or equal to the threshold BER, at which time the method 300 may move to the programming of the net delay values for continued use (360).

In various embodiments, when the first programmable analog delay circuit 122 is a first tapped delay line and the second programmable analog delay circuit 126 is a second tapped delay line, method 300 may, when determining that the present BER is less than or equal to the threshold BER (e.g., in blocks 325 and 345), perform some additional actions. For example, the method 300 may continue with the processing logic determining a tap value corresponding to the first net delay value and signaling the first tapped delay line with the tap value to generate the first delay on the positive conductor 112. The method 300 may also continue with the processing logic determining a tap value corresponding to the second net delay value and signaling the first tapped delay line with the tap value to generate the second delay on the negative conductor 116.

The embodiments of the systems 100 and 200 of FIGS. 1-2 may include various advantages over previous solutions. For example, there may be no additional costs and no PCB material wastage due to not tilting the CAD image on the panel by a certain angle. The embodiments reduce extra efforts and time during PCB layout phase, as there may be little need for special routing or tight length matching between the positive and negative signals of a differential pair of signals, e.g., no need for zig-zag or angle routing. Furthermore, skews within +/−3 ps may be realistically obtained. Even if CAD tools fail to match the positive and negative signals in the layout, skew may be adjusted without re-spinning the board.

Figure 6:
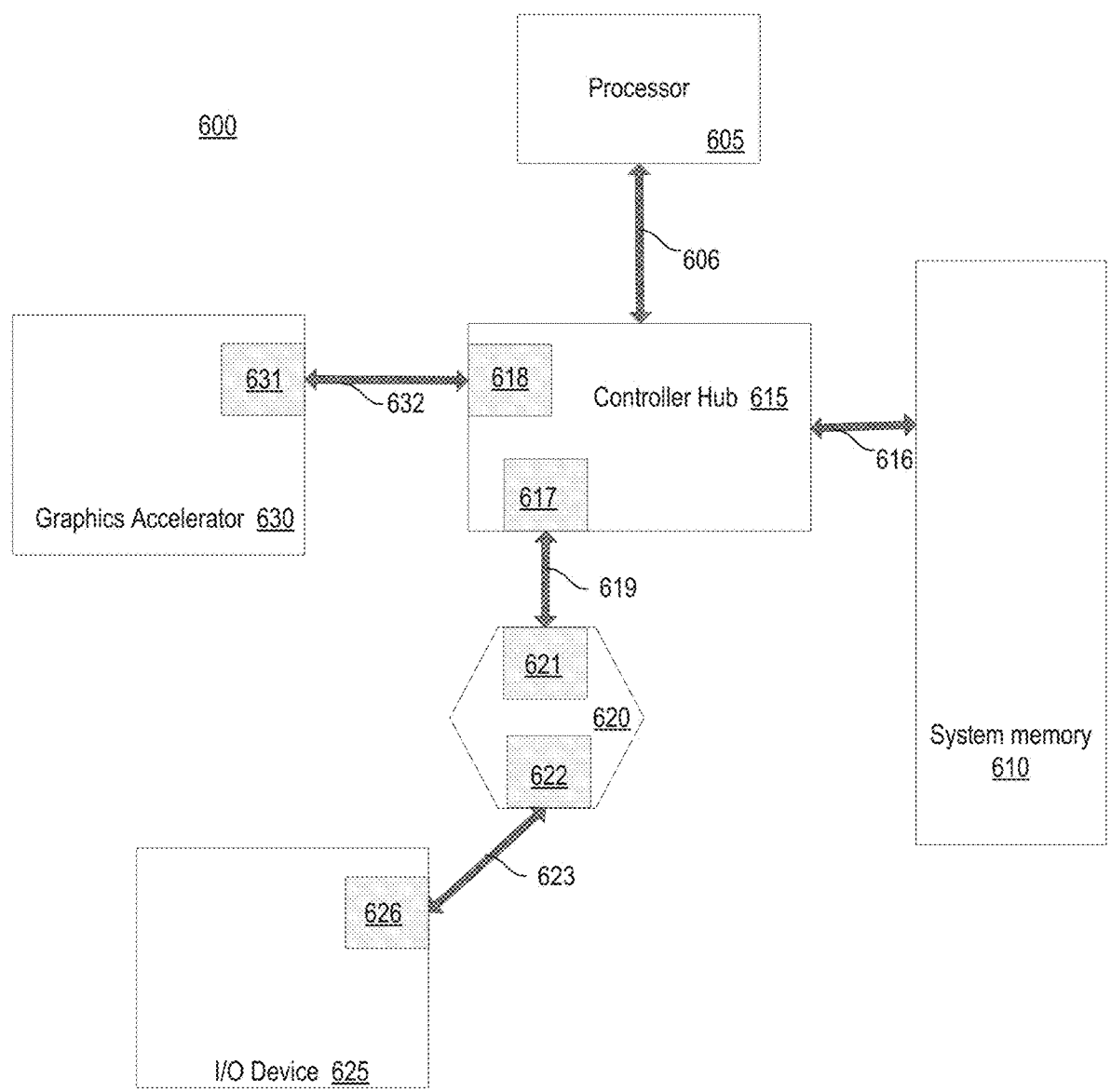
FIG. 6 is a block diagram of a computing system including an interconnect fabric architecture, according to an embodiment of the present disclosure.

FIG. 6 is a block diagram of a computing system including an interconnect fabric architecture, according to an embodiment of the present disclosure. Referring to FIG. 6, an embodiment of a fabric composed of point-to-point links that interconnect a set of components is illustrated. System 600 includes processor 605 and system memory 610 coupled to controller hub 615. Processor 605 includes a processing element, such as a microprocessor, a host processor, an embedded processor, a co-processor, or other processor. Processor 605 is coupled to controller hub 615 through front-side bus (FSB) 606. In one embodiment, FSB 606 is a serial point-to-point interconnect as described below. In another embodiment, link 606 includes a serial, differential interconnect architecture that is compliant with different interconnect standards.

System memory 610 includes a memory device, such as random access memory (RAM), non-volatile (NV) memory, or other memory accessible by devices in system 600. System memory 610 is coupled to controller hub 615 through memory interface 616. Examples of a memory interface include a double-data rate (DDR) memory interface, a dual-channel DDR memory interface, and a dynamic RAM (DRAM) memory interface.

In one embodiment, controller hub 615 is a root hub, root complex, or root controller in a PCIe® (or PCIE®) interconnection hierarchy, although can also exist within other point-to-point, serial, differential, layered protocol or interconnect fabric architectures by way of example. Examples of controller hub 615 include a chipset, a memory controller hub (MCH), a Northbridge, an interconnect controller hub (ICH) a Southbridge, and a root controller/hub. Often the term chipset refers to two physically separate controller hubs, i.e. a memory controller hub (MCH) coupled to an interconnect controller hub (ICH). Note that current systems often include the MCH integrated with processor 605, while controller hub 615 is to communicate with I/O devices, in a similar manner as described below. In some embodiments, peer-to-peer routing is optionally supported through root complex 615.

Here, controller hub 615 is coupled to switch/bridge 620 through serial link 619. Input/output modules 617 and 621, which can also be referred to as interfaces/ports 617 and 621, include/implement a layered protocol stack to provide communication between controller hub 615 and switch 620. In one embodiment, multiple devices are capable of being coupled to switch 620.

Switch/bridge 620 routes packets/messages from device 625 upstream, i.e. up a hierarchy towards a root complex, to controller hub 615 and downstream, i.e. down a hierarchy away from a root controller, from processor 605 or system memory 610 to device 625. Switch 620, in one embodiment, is referred to as a logical assembly of multiple virtual PCI-to-PCI bridge devices. Device 625 includes an internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a FireWire® device, a Universal Serial Bus (USB) device, a scanner, and other input/output devices. Often in the PCIe® vernacular, such a device is referred to as an endpoint. Although not specifically shown, device 625 can include a PCIe® to PCI/PCI-X bridge to support legacy or other version PCI™ devices. Endpoint devices in PCIe are often classified as legacy, PCIe®, or root complex integrated endpoints.

Graphics accelerator 630 is also coupled to controller hub 615 through serial link 632. In one embodiment, graphics accelerator 630 is coupled to an MCH, which is coupled to an ICH. Switch 620, and accordingly I/O device 625, is then coupled to the ICH. I/O modules 631 and 618 are also to implement a layered protocol stack to communicate between graphics accelerator 630 and controller hub 615. Similar to the MCH discussion above, a graphics controller or the graphics accelerator 630 itself can be integrated in processor 605.

Figure 7:
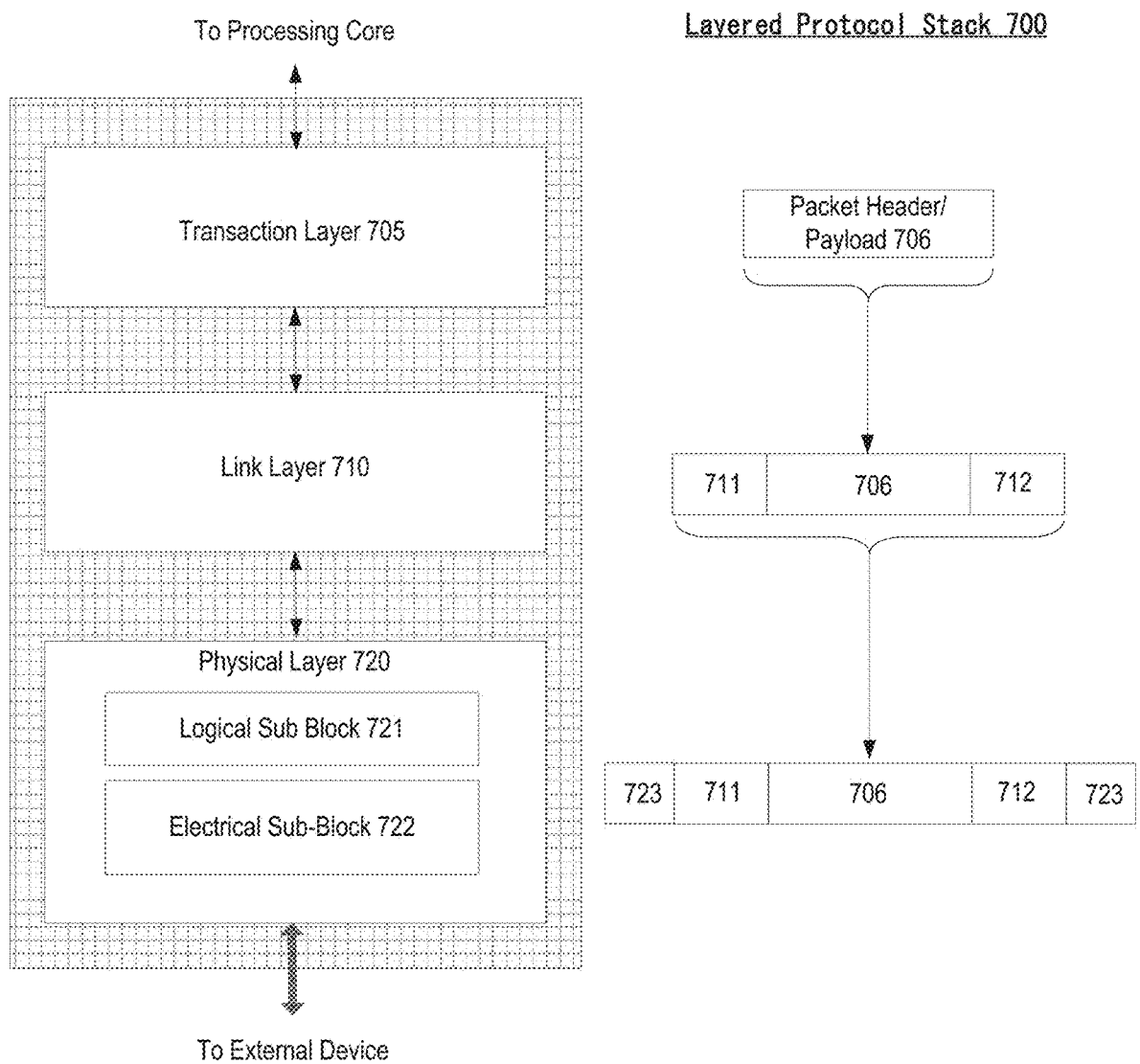
FIG. 7 is a block diagram of an interconnect fabric architecture including a layered stack, according to an embodiment of the present disclosure.
Figure 8:
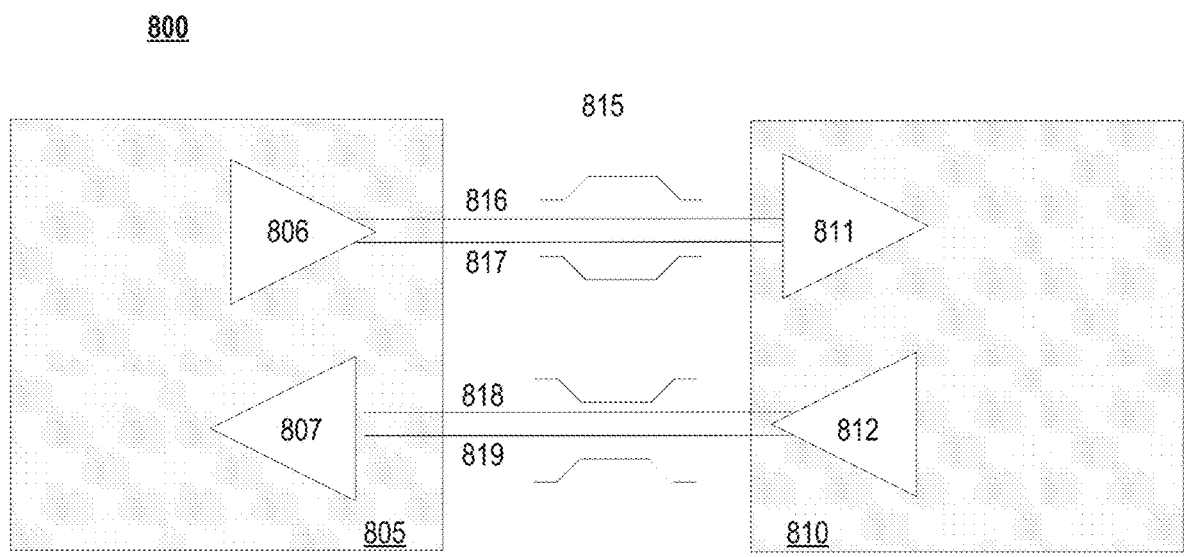
FIG. 8 is a block diagram of a transmitter and receiver pair usable within an interconnect fabric architecture or a serial point-to-point interconnect fabric, according to an embodiment of the present disclosure.

Turning to FIG. 7, an embodiment of a layered protocol stack is illustrated. Layered protocol stack 700 includes a form of a layered communication stack, such as a Quick Path Interconnect (QPI) stack, a PCIe® stack, a next generation high performance computing interconnect stack, or other layered stack. Although the discussion immediately below in reference to FIGS. 6-8 are in relation to a PCIe® stack, the same concepts can be applied to other interconnect stacks. In one embodiment, protocol stack 700 is a PCIe protocol stack including transaction layer 705, link layer 710, and physical layer 720. An interface, such as interfaces 617, 618, 621, 622, 626, and 631 in FIG. 6, can be represented as communication protocol stack 700. Representation as a communication protocol stack can also be referred to as a module or interface implementing/including a protocol stack.

In one embodiment, interfaces 617, 618 and 622 can include components of the processor 102 to reduce skew in a transmitted differential signal, which are discussed with reference to FIGS. 1-3. Similarly, interfaces 621, 631 and 626 can include the receiver 148 and bit error checker 150 to reduce skew in a transmitted differential signal, which are also discussed with reference to FIGS. 1-3. Accordingly, a clock signal or clocked data from one of interfaces 617, 618 or 622 can be distributed to one of the interfaces 621, 631 or 626, respectively, with reduced skew as discussed herein, and be recovered/reconstructed by circuitry within the interface 621, 631 or 626.

PCI Express® uses packets to communicate information between components. Packets are formed in the transaction layer 705 and data link layer 710 to carry the information from the transmitting component to the receiving component. As the transmitted packets flow through the other layers, they are extended with additional information necessary to handle packets at those layers. At the receiving side the reverse process occurs and packets get transformed from their physical layer 720 representation to the data link layer 710 representation and finally (for transaction layer packets) to the form that can be processed by the transaction layer 705 of the receiving device.

Transaction Layer

In one embodiment, transaction layer 705 is to provide an interface between a device's processing core and the interconnect architecture, such as data link layer 710 and physical layer 720. In this regard, a primary responsibility of the transaction layer 705 is the assembly and disassembly of packets (e.g., transaction layer packets, or TLPs). The translation layer 705 typically manages credit-base flow control for TLPs. PCIe® implements split transactions, i.e. transactions with request and response separated by time, allowing a link to carry other traffic while the target device gathers data for the response.

In addition, PCIe® utilizes credit-based flow control. In this scheme, a device advertises an initial amount of credit for each of the receive buffers in transaction layer 705. An external device at the opposite end of the link, such as controller hub 615 in FIG. 6, counts the number of credits consumed by each TLP. A transaction can be transmitted if the transaction does not exceed a credit limit. Upon receiving a response, an amount of credit is restored. An advantage of a credit scheme is that the latency of credit return does not affect performance, provided that the credit limit is not encountered.

In one embodiment, four transaction address spaces include a configuration address space, a memory address space, an input/output (I/O) address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe® devices. Transactions to the configuration space include read requests and write requests. Message space transactions (or, simply messages) are defined to support in-band communication between PCIe® agents.

Therefore, in one embodiment, transaction layer 705 assembles packet header/payload 706. Format for current packet headers/payloads can be found in the PCIe® specification at the PCIe® specification website.

Link Layer

Link layer 710, also referred to as data link layer 710, acts as an intermediate stage between transaction layer 705 and the physical layer 720. In one embodiment, a responsibility of the data link layer 710 is providing a reliable mechanism for exchanging transaction layer packets (TLPs) between two components a link. One side of the data link layer 710 accepts TLPs assembled by the transaction layer 705, applies packet sequence identifier 711, i.e. an identification number or packet number, calculates and applies an error detection code, i.e. CRC 712, and submits the modified TLPs to the physical layer 720 for transmission across a physical to an external device.

Physical Layer

In one embodiment, physical layer 720 includes logical sub-block 721 and electrical sub-block 722 to physically transmit a packet to an external device. Here, logical sub-block 721 is responsible for the "digital" functions of physical layer 720. In this regard, the logical sub-block includes a transmit section to prepare outgoing information for transmission by electrical (e.g., physical) sub-block 722, and a receiver section to identify and prepare received information before passing it to the Link Layer 710.

In one embodiment, the electrical sub-block 722 includes a transmitter and/or a receiver, and can therefore include components of the processor 102 (for transmission), components of the device receiver 140 or 240 (for reception) or both (for both transmission and reception, respectively). In this way, skew in a differential signal may be reduced when transmitted from the physical layer 720 of a transmitting device (e.g., from the processor 102) to a physical layer 720 of a receiving device (e.g., to the device receiver 140), as described in FIGS. 1A and 1B.

The transmitter can also, alternatively or additionally, be supplied by logical sub-block 721 with symbols, which the transmitter serializes and transmits onto to an external device. The receiver is supplied with serialized symbols from an external device and transforms the received signals into a bit-stream. The bit-stream is de-serialized and supplied to logical sub-block 721. In one embodiment, an 8b/10b transmission code is employed, where ten-bit symbols are transmitted/received. Here, special symbols can be used to frame a packet with frames 723. In addition, in one example, the receiver also provides a symbol clock recovered/reconstructed from the incoming serial stream.

As stated above, although transaction layer 705, link layer 710, and physical layer 720 are discussed in reference to a specific embodiment of a PCIe® protocol stack, a layered protocol stack is not so limited. In fact, any layered protocol may be included/implemented. As an example, a port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

FIG. 8 is a block diagram of a transmitter and receiver pair 800 usable within an interconnect fabric architecture and within a serial point-to-point fabric, according to an embodiment of the present disclosure. Although an embodiment of a PCIe® serial point-to-point link is illustrated, a serial point-to-point link is not so limited, as it includes a transmission path for transmitting serial data. In the embodiment shown, a basic PCIe® link includes two, low-voltage, differentially driven signal pairs: a transmit pair 806/811 and a receive pair 812/807. Accordingly, device 805 includes transmission logic 806 to transmit data to device 810 and receiving logic 807 to receive data from device 810. In other words, two transmitting paths, i.e. paths 816 and 817, and two receiving paths, i.e. paths 818 and 819, are included in a PCIe® link.

In one embodiment, transmission logic 806 and 812 can each include the test pattern generator 106, the transmitter 108, the first programmable analog delay circuit 122, the second programmable analog delay circuit 126, and the controller 130 such as displayed in and discussed with reference to FIGS. 1A and 1B. Further, the receiving logic 811 and 807 can each include a receiver 148 and a bit error checker 150 as displayed in and discussed with reference to FIGS. 1A and 1B. In this way, the device 805 can distribute data, a clock, or perform CDR with reference to the device 810, as discussed with reference to FIG. 1. Similarly, the device 810 can distribute data, a clock, or perform CDR with reference to the device 805, as discussed with reference to FIGS. 1A and 1B. In one embodiment, the programmable analog delay circuits 122, 126 and the controllers 130 may be coupled to the receiver 811 of device 810, to receiver 807 of device 805, or to the transmitter 812 of device 810.

A transmission path (or link) refers to a path for transmitting data, such as a transmission line, a copper line, an optical line, a wireless communication channel, an infrared communication link, or other communication path. A connection between two devices, such as device 805 and device 810, is referred to as a link, such as link 815. A link may support one lane—each lane representing a set of differential signal pairs (one pair for transmission, one pair for reception). To scale bandwidth, a link may aggregate multiple lanes denoted by ×N, where N is a supported Link width, such as 1, 2, 4, 8, 12, 16, 32, 64, or wider. In one embodiment, the transmission logic 806 or 812 can include or make up a part of the processor 102 or 202. Similarly, the receiving logic 807 or 811 can include or make up a part of the device receiver 140 or 240.

A differential pair refers to two transmission paths, such as lines 816 and 817, to transmit differential signals. As an example, when line 816 toggles from a low voltage level to a high voltage level, i.e. a rising edge, line 817 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

Figure 9:
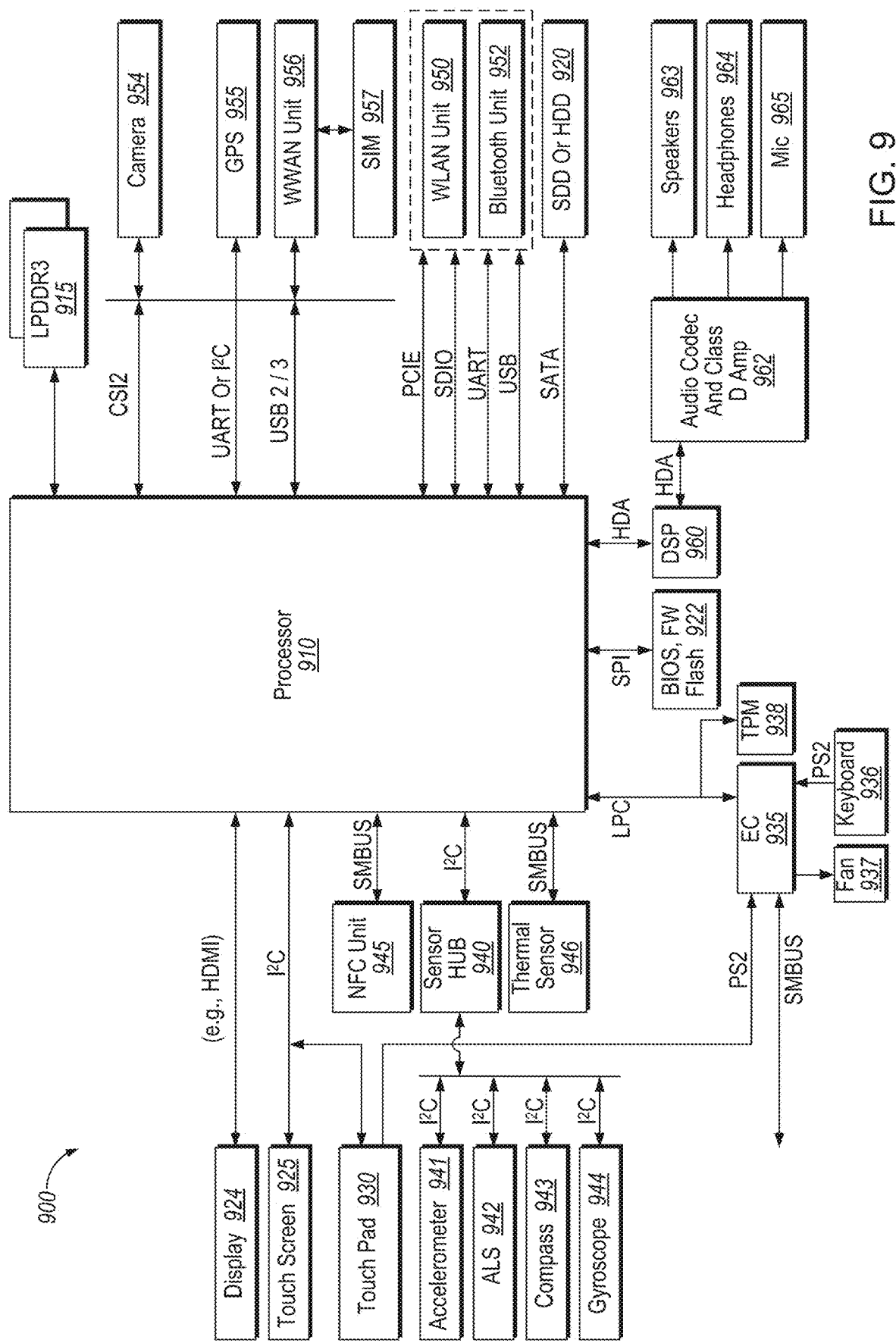
FIG. 9 is a block diagram of a computing system, according to an embodiment of the present disclosure.

Referring now to FIG. 9, a block diagram of components present in a computer system in accordance with an embodiment of the present disclosure is illustrated. As shown in FIG. 9, system 900 includes a combination of components. These components can be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 9 is intended to show a high level view of many components of the computer system. However, it is to be understood that some of the components shown can be omitted, additional components can be present, and different arrangement of the components shown can occur in other implementations. As a result, the disclosure described above can be implemented in any portion of one or more of the interconnects illustrated or described below.

As seen in FIG. 9, a processor 910, in one embodiment, includes a microprocessor, multi-core processor, multi-threaded processor, an ultra-low voltage processor, an embedded processor, or other known processing element. In one embodiment, the processor 910 can include the processor 102 (or SoC). In this way, the processor 910 can act as the transmitter for transmission of a differential signal as discussed herein, and the various connected I/O and other connected devices can act as the device receiver 140 or 240.

In the illustrated implementation, processor 910 acts as a main processing unit and central hub for communication with many of the various components of the system 900. As one example, processor 900 is implemented as a system on a chip (SoC). As a specific illustrative example, processor 910 includes an Intel® Architecture Core™-based processor such as an i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from Imagination Technologies, of Kings Langley, Hertfordshire, UK, an ARM-based design licensed from ARM Holdings, Ltd. or customer thereof, or their licensees or adopters can instead be present in other embodiments such as an Apple A5/A6 processor, a Qualcomm Snapdragon processor, or TI OMAP processor. Note that many of the customer versions of such processors are modified and varied; however, they can support or recognize a specific instructions set that performs defined algorithms as set forth by the processor licensor. Here, the microarchitectural implementation can vary, but the architectural function of the processor is usually consistent. Certain details regarding the architecture and operation of processor 910 in one implementation will be discussed further below to provide an illustrative example.

Processor 910, in one embodiment, communicates with a system memory 915. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices can be of different package types such as single die package (SDP), dual die package (DDP) or quad die package (Q17P). These devices, in some embodiments, are directly soldered onto a motherboard to provide a lower profile solution, while in other embodiments the devices are configured as one or more memory modules that in turn couple to the motherboard by a given connector. And, other memory implementations are possible such as other types of memory modules, e.g., dual inline memory modules (DIMMs) of different varieties including but not limited to microDIMMs, Mini-DIMMs. In a particular illustrative embodiment, memory is sized between 2 GB and 16 GB, and can be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 920 can also couple to processor 910. In various embodiments, to enable a thinner and lighter system design as well as to improve system responsiveness, this mass storage can be implemented via a solid state drive (SSD). However in other embodiments, the mass storage can primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 9, a flash device 922 can be coupled to processor 910, e.g., via a serial peripheral interface (SPI). This flash device can provide for non-volatile storage of system software, including a basic input/output software (BIOS) as well as other firmware of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache can be configured as a single level cache (SLC) or multi-level cache (MLC) option to provide an appropriate level of responsiveness. In a SSD-only option, the module can be accommodated in various locations such as in a mSATA or NGFF slot. As an example, an SSD has a capacity ranging from 120 GB-1 TB.

Various input/output (I/O) devices can be present within system 900. Specifically shown in the embodiment of FIG. 9 is a display 924 which can be a high definition LCD or LED panel configured within a lid portion of the chassis. This display panel can also provide for a touch screen 925, e.g., adapted externally over the display panel such that via a user's interaction with this touch screen, user inputs can be provided to the system to enable desired operations, e.g., with regard to the display of information, accessing of information and so forth. In one embodiment, display 924 can be coupled to processor 910 via a display interconnect that can be implemented as a high performance graphics interconnect. Touch screen 925 can be coupled to processor 910 via another interconnect, which in an embodiment can be an I²C interconnect. As further shown in FIG. 9, in addition to touch screen 925, user input by way of touch can also occur via a touch pad 930 which can be configured within the chassis and can also be coupled to the same I²C interconnect as touch screen 925.

For perceptual computing and other purposes, various sensors can be present within the system and can be coupled to processor 910 in different manners. Certain inertial and environmental sensors may couple to processor 910 through a sensor hub 940, e.g., via an I²C interconnect. In the embodiment shown in FIG. 9, these sensors can include an accelerometer 941, an ambient light sensor (ALS) 942, a compass 943 and a gyroscope 944. Other environmental sensors can include one or more thermal sensors 946 which in some embodiments couple to processor 910 via a system management bus (SMBus) bus.

Using the various inertial and environmental sensors present in a platform, many different use cases can be realized. These use cases enable advanced computing operations including perceptual computing and also allow for enhancements with regard to power management/battery life, security, and system responsiveness. For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it can be determined whether a user is allowed to access certain secure documents. For example, a user can be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations can include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing can be disabled. Furthermore, when pairing a platform as described herein and a smartphone, an alarm can be configured to be triggered when the devices move more than a predetermined distance from each other, when in a public location. In contrast, when these paired devices are in a safe location, e.g., a work place or home location, the devices can exceed this predetermined limit without triggering such alarm.

Responsiveness can also be enhanced using the sensor information. For example, even when a platform is in a low power state, the sensors can still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases can be enabled using sensor information obtained via the integrated sensors within a platform as described herein, and the above examples are only for purposes of illustration. Using a system as described herein, a perceptual computing system can allow for the addition of alternative input modalities, including gesture recognition, and enable the system to sense user operations and intent.

In various embodiments, the accelerometer can be a 3-axis accelerometer having data rates of at least 50 Hz. A gyroscope can also be included, which can be a 3-axis gyroscope. In addition, an e-compass/magnetometer can be present. Also, one or more proximity sensors can be provided (e.g., for lid open to sense when a person is in proximity (or not) to the system and adjust power/performance to extend battery life). For some OS's Sensor Fusion capability including the accelerometer, gyroscope, and compass can provide enhanced features. In addition, via a sensor hub having a real-time clock (RTC), a wake from sensors mechanism can be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

In an embodiment, the OS can be a Microsoft® Windows® 8 OS that implements Connected Standby (also referred to herein as Win8 CS). Windows 8 Connected Standby or another OS having a similar state can provide, via a platform as described herein, very low ultra-idle power to enable applications to remain connected, e.g., to a cloud-based location, at very low power consumption. The platform can supports three power states, namely screen on (normal); Connected Standby (as a default "off" state); and shutdown (zero watts of power consumption). Thus in the Connected Standby state, the platform is logically on (at minimal power levels) even though the screen is off. In such a platform, power management can be made to be transparent to applications and maintain constant connectivity, in part due to offload technology to enable the lowest powered component to perform an operation.

Also seen in FIG. 9, various peripheral devices may couple to processor 910 via a low pin count (LPC) interconnect. In the embodiment shown, various components can be coupled through an embedded controller 935. Such components can include a keyboard 936 (e.g., coupled via a PS2 interface), a fan 937, and a thermal sensor 939. In some embodiments, touch pad 930 can also couple to EC 935 via a PS2 interface. In addition, a security processor such as a trusted platform module (TPM) 938 in accordance with the Trusted Computing Group (TCG) TPM Specification Version 1.2, dated Oct. 2, 2003, can also couple to processor 910 via this LPC interconnect. However, understand the scope of the present disclosure is not limited in this regard and secure processing and storage of secure information can be in another protected location such as a static random access memory (SRAM) in a security coprocessor, or as encrypted data blobs that are only decrypted when protected by a secure enclave (SE) processor mode.

In a particular implementation, peripheral ports can include a high definition media interface (HDMI™) connector (which can be of different form factors such as full size, mini or micro); one or more USB ports, such as full-size external ports in accordance with the Universal Serial Bus Revision 3.0 Specification (November 2008), with at least one powered for charging of USB devices (such as smartphones) when the system is in Connected Standby state and is plugged into AC wall power. In addition, one or more Thunderbolt™ ports can be provided. Other ports can include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 900 can communicate with external devices in a variety of manners, including wirelessly. In the embodiment shown in FIG. 9, various wireless modules, each of which can correspond to a radio configured for a particular wireless communication protocol, are present. One manner for wireless communication in a short range such as a near field can be via a near field communication (NFC) unit 945 which can communicate, in one embodiment with processor 910 via an SMBus. Note that via this NFC unit 945, devices in close proximity to each other can communicate. For example, a user can enable system 900 to communicate with another, e.g., portable device such as a smartphone of the user via adapting the two devices together in close relation and enabling transfer of information such as identification information payment information, data such as image data or so forth. Wireless power transfer can also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 9, additional wireless units can include other short range wireless engines including a WLAN unit 950 and a Bluetooth unit 952. Using WLAN unit 950, Wi-Fi™ communications in accordance with a given Institute of Electrical and Electronics Engineers (IEEE) 802.11 standard can be realized, while via Bluetooth® unit 952 (of Bluetooth Special Interest Group), short range communications via a Bluetooth® protocol can occur. These units may communicate with processor 910 via, e.g., a USB link or a universal asynchronous receiver transmitter (UART) link. Or these units may couple to processor 910 via an interconnect according to a Peripheral Component Interconnect Express® (PCIe®) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which can be configured on one or more add-in cards, can be by way of the Next Generation Form Factor (NGFF) connectors adapted to a motherboard.

In addition, wireless wide area communications, e.g., according to a cellular or other wireless wide area protocol (WWAN), can occur via a WWAN unit 956 which in turn may couple to a subscriber identity module (SIM) 957. In addition, to enable receipt and use of location information, a GPS module 955 can also be present. Note that in the embodiment shown in FIG. 9, WWAN unit 956 and an integrated capture device such as a camera module 954 may communicate via any of a number of protocols. In one embodiment, the camera module 954 communicates via a given USB protocol such as a USB 2.0 or 3.0 link, or a UART or I²C protocol. In another embodiment, the camera modules 154 communicates via a Camera Serial Interface (CSI) such as CSI2. Again, the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11abgn) with support for Windows® 8 CS. This card can be configured in an internal slot (e.g., via an NGFF adapter). An additional module can provide for Bluetooth capability (e.g., Bluetooth® 4.0 with backwards compatibility) as well as Intel® Wireless Display functionality. In addition NFC support can be provided via a separate device or multi-function device, and can be positioned as an example, in a front right portion of the chassis for easy access. A still additional module can be a WWAN device that can provide support for 3G/4G/LTE and GPS. This module can be implemented in an internal (e.g., NGFF) slot. Integrated antenna support can be provided for WiFi™, Bluetooth®, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 960, which may couple to processor 910 via a high definition audio (HDA) link. Similarly, DSP 960 may communicate with an integrated coder/decoder (CODEC) and amplifier 962 that in turn may couple to output speakers 963 which can be implemented within the chassis. Similarly, amplifier and CODEC 962 can be coupled to receive audio inputs from a microphone 965 which in an embodiment can be implemented via dual array microphones (such as a digital microphone array) to provide for high quality audio inputs to enable voice-activated control of various operations within the system. Note also that audio outputs can be provided from amplifier/CODEC 962 to a headphone jack 964. Although shown with these particular components in the embodiment of FIG. 9, understand the scope of the present disclosure is not limited in this regard.

In a particular embodiment, the digital audio codec and amplifier are capable of driving the stereo headphone jack, stereo microphone jack, an internal microphone array and stereo speakers. In different implementations, the codec can be integrated into an audio DSP or coupled via an HD audio path to a peripheral controller hub (PCH). In some implementations, in addition to integrated stereo speakers, one or more bass speakers can be provided, and the speaker solution can support DTS audio.

In some embodiments, processor 910 can be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR can be powered down or off when the processor is placed into a certain low power state, while another power plane of another FIVR remains active, or fully powered.

In one embodiment, a sustain power plane can be used during some deep sleep states to power on the I/O pins for several I/O signals, such as the interface between the processor and a PCH, the interface with the external VR and the interface with EC 935. This sustain power plane also powers an on-die voltage regulator that supports the on-board SRAM or other cache memory in which the processor context is stored during the sleep state. The sustain power plane is also used to power on the processor's wakeup logic that monitors and processes the various wakeup source signals.

In different implementations, a security module such as a TPM can be integrated into a processor or can be a discrete device such as a TPM 2.0 device. With an integrated security module, also referred to as Platform Trust Technology (PTT), BIOS/firmware can be enabled to expose certain hardware features for certain security features, including secure instructions, secure boot, Intel® Anti-Theft Technology, Intel® Identity Protection Technology, Intel® Trusted Execution Technology (TXT), and Intel® Manageability Engine Technology along with secure user interfaces such as a secure keyboard and display.

Figure 10:
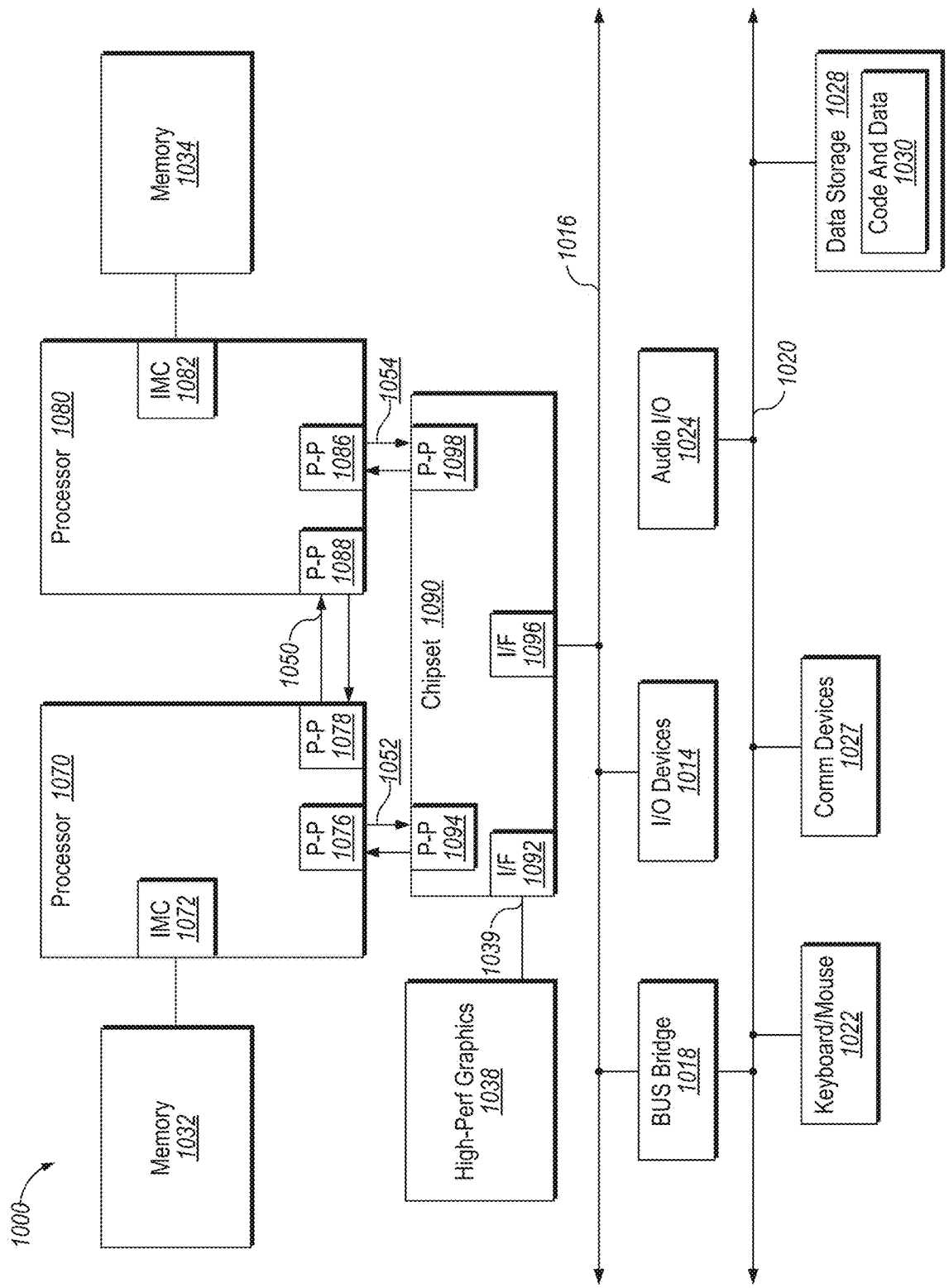
FIG. 10 is a block diagram of a computing system, according to another embodiment of the present disclosure.

Referring now to FIG. 10, shown is a block diagram of a second system 1000 in accordance with an embodiment of the present disclosure. As shown in FIG. 10, multiprocessor system 1000 is a point-to-point interconnect system, and includes a first processor 1070 and a second processor 1080 coupled via a point-to-point interconnect 1050. Each of processors 1070 and 1080 can be some version of a processor. In one embodiment, 1052 and 1054 are part of a serial, point-to-point coherent interconnect fabric, such as Intel's Quick Path Interconnect (QPI) architecture. As a result, the disclosure can be implemented within the QPI architecture.

While shown with only two processors 1070, 1080, it is to be understood that the scope of the present disclosure is not so limited. In other embodiments, one or more additional processors can be present in a given processor.

Processors 1070 and 1080 are shown including integrated memory controller units 1072 and 1082, respectively. Processor 1070 also includes as part of its bus controller units point-to-point (P-P) interfaces 1076 and 1078; similarly, second processor 1080 includes P-P interfaces 1086 and 1088. Processors 1070, 1080 can exchange information via a point-to-point (P-P) interface 1050 using P-P interface circuits 1078, 1088. As shown in FIG. 10, IMCs 1072 and 1082 couple the processors to respective memories, namely a memory 1032 and a memory 1034, which can be portions of main memory locally attached to the respective processors.

Processors 1070, 1080 each exchange information with a chipset 1090 via individual P-P interfaces 1052, 1054 using point to point interface circuits 1076, 1094, 1086, 1098. Chipset 1090 also exchanges information with a high-performance graphics circuit 1038 via an interface circuit 1092 along a high-performance graphics interconnect 1039. In one embodiment, the interface circuit 1092 includes components of the processor 102, and the high performance graphics circuit 1038 includes components of the device receiver 140 or 240. Accordingly, the interface circuit 1092 can transmit a differential signal as discussed with reference to FIGS. 1-3.

A shared cache (not shown) can be included in either processor or outside of both processors; yet connected with the processors via P-P interconnect, such that either or both processors' local cache information can be stored in the shared cache if a processor is placed into a low power mode.

Chipset 1090 can be coupled to a first bus 1016 via an interface 1096. In one embodiment, first bus 1016 can be a Peripheral Component Interconnect (PCI) bus, or a bus such as a PCI Express® bus or another third generation I/O interconnect bus, although the scope of the present disclosure is not so limited.

As shown in FIG. 10, various I/O devices 1014 are coupled to first bus 1016, along with a bus bridge 1018 which couples first bus 1016 to a second bus 1020. In one embodiment, second bus 1020 includes a low pin count (LPC) bus. Various devices are coupled to second bus 1020 including, for example, a keyboard and/or mouse 1022, communication devices 1027 and a storage unit 1028 such as a disk drive or other mass storage device which often includes instructions/code and data 1030, in one embodiment. Further, an audio I/O 1024 is shown coupled to second bus 1020. Note that other architectures are possible, where the included components and interconnect architectures vary. For example, instead of the point-to-point architecture of FIG. 10, a system can implement a multi-drop bus or other such architecture.

In one embodiment, the interface 1096 includes one or more components of the processor 102 (or SoC) any of the connected devices (off of first bus 1016 or the second bus 1020) may include the receiver 148 and bit error checker 150, according to the present disclosure. Accordingly, the interface circuit 1096 can reduce skew in a differential signal as discussed with reference to FIGS. 1-3.

The following examples pertain to further embodiments.

Example 1 is a device comprising: 1) a transmitter to transmit, to a receiver, a differential pair of signals comprising a positive signal transmitted across a positive conductor and a negative signal transmitted across a negative conductor; 2) a first programmable analog delay circuit coupled to the positive conductor to provide a first delay to the positive signal; 3) a second programmable analog delay circuit coupled to the negative conductor to provide a second delay to the negative signal; and 4) a controller coupled to the first programmable analog delay circuit and to the second programmable analog delay circuit, the controller to: a) receive, over a transmission link with the receiver, data based on a bit error rate (BER) of the differential pair of signals as measured by a bit error checker of the receiver; and b) in response to a determination that the BER is less than a threshold BER, store a first delay value to program the first delay of the first programmable analog delay circuit and store a second delay value to program the second delay of the second programmable analog delay circuit.

In Example 2, the device of Example 1, wherein the transmitter, the positive conductor, and the negative conductor are disposed on a printed circuit board.

In Example 3, the device of Example 1, wherein the first programmable analog delay circuit comprises a first tapped delay line and the second programmable analog delay circuit comprises a second tapped delay line.

In Example 4, the device of Example 3, wherein to store the first delay value comprises to store a tap value for the first tapped delay line of the first programmable analog delay circuit that generates the first delay.

In Example 5, the device of Example 1, further comprising a test pattern generator coupled to the transmitter, the test pattern generator to generate a test bit pattern for transmission within the differential pair of signals, the test bit pattern being known to the bit error checker.

In Example 6, the device of Example 1, wherein the controller comprises a first register to store the first delay value for the first delay and a second register to store the second delay value for the second delay.

In Example 7, the device of Example 1, wherein the BER comprises a first BER, and wherein the controller is further to: a) in response to the first BER being greater than the threshold BER, add a fixed delay value to the first delay value to generate a first net delay value; b) receive, over the transmission link, a second BER based on use of the first net delay value; c) in response to the second BER being less than the first BER, add the fixed delay value to the first net delay value; and d) in response to a determination that a third BER, which follows the second BER, is less than the threshold BER, store the first net delay value to program the first delay of the first programmable analog delay circuit.

In Example 8, the device of Example 1, wherein the BER comprises a first BER, and wherein the controller is further to: a) in response to the first BER being greater than the threshold BER, add a fixed delay value to the first delay value to generate a first net delay value; b) receive, over the transmission link, a second BER based on use of the first net delay value; c) in response to the second BER being greater than the first BER: i) set the first net delay value to zero; and ii) add the fixed delay value to the second delay value to generate a second net delay value; and d) in response to a determination that a third BER, which follows the second BER, is less than the threshold BER, store the first net delay value to program the first delay of the first programmable analog delay circuit and store the second net delay value to program the second delay of the second programmable analog delay circuit.

Various embodiments can have different combinations of the structural features described above. For instance, all optional features of the computing system described above can also be implemented with respect to the method or process described herein and specifics in the examples can be used anywhere in one or more embodiments.

Example 9 is a system comprising: 1) a test pattern generator to generate a test bit pattern; 2) a receiver and a bit error checker coupled to the receiver, the bit error checker to determine a bit error rate (BER) in a received signal that carries the test bit pattern; 3) a transmitter communicably coupled to the receiver and the test pattern generator, the transmitter to transmit, to the receiver, a differential pair of signals with the test bit pattern, the differential pair of signals comprising a positive signal transmitted across a positive conductor and a negative signal transmitted across a negative conductor; 4) a first programmable analog delay circuit coupled to the positive conductor to provide a first delay to the positive signal; 5) a second programmable analog delay circuit coupled to the negative conductor to provide a second delay to the negative signal; and 6) a controller coupled to the first programmable analog delay circuit and to the second programmable analog delay circuit, the controller to: a) receive, over a transmission link with the bit error checker, data based on the BER of the differential pair of signals; and b) in response to a determination that the BER is less than a threshold BER, store a first delay value to program the first delay of the first programmable analog delay circuit and store a second delay value to program the second delay of the second programmable analog delay circuit.

In Example 10, the system of Example 8, wherein the controller comprises a first register to store the first delay value for the first delay and a second register to store the second delay value for the second delay.

In Example 11, the system of Example 8, wherein the first programmable analog delay circuit comprises a first tapped delay line and the second programmable analog delay circuit comprises a second tapped delay line.

In Example 12, the system of Example 11, wherein to store the first delay value comprises to store a first tap value for the first tapped delay line that generates the first delay, and wherein to store the second delay value comprises to store a second tap value for the second tapped delay line that generates the second delay.

In Example 13, the system of Example 11, wherein the BER comprises a first BER, and wherein the controller is further to: a) in response to the first BER being greater than the threshold BER, add a fixed delay value to the first delay value to generate a first net delay value; b) receive, over the transmission link, a second BER based on use of the first net delay value; c) in response to the second BER being less than the first BER, add the fixed delay value to the first net delay value; and d) in response to a determination that a third BER, which follows the second BER, is less than the threshold BER: i) determine a tap value corresponding to the first net delay value; and ii) signal the first tapped delay line with the tap value to generate the first delay on the positive conductor.

In Example 14, the system of Example 11, wherein the BER comprises a first BER, and wherein the controller is further to: a) in response to the first BER being greater than the threshold BER, add a fixed delay value to the first delay value to generate a first net delay value; b) receive, over the transmission link, a second BER based on use of the first net delay value; c) in response to the second BER being greater than the first BER: i) set the first net delay value to zero; and ii) add the fixed delay value to the second delay value to generate a second net delay value; and d) in response to a determination that a third BER, which follows the second BER, is less than the threshold BER: i) determine a tap value corresponding to the second net delay value; and ii) signal the second tapped delay line with the tap value to generate the second net delay on the negative conductor.

Various embodiments can have different combinations of the structural features described above. For instance, all optional features of the computing system described above can also be implemented with respect to the method or process described herein and specifics in the examples can be used anywhere in one or more embodiments.

Example 15 is a method comprising: 1) resetting, by a controller, a first delay value for a positive signal and a second delay value for a negative signal of a differential pair of signals; 2) transmitting, by a transmitter to a receiver, the differential pair of signals comprising the positive signal transmitted across a positive conductor and the negative signal transmitted across a negative conductor, wherein the differential pair of signals including a test bit pattern; 3) receiving, from a bit error checker of the receiver, data based on a bit error rate (BER) of the test bit pattern in the differential pair of signals, as received by the receiver; 4) determining, by a controller coupled to a first programmable analog delay circuit of the positive conductor and to a second programmable analog delay circuit of the negative conductor, whether the BER is less than a threshold BER;

and 5) in response to determining that the BER is less than the threshold BER: a) storing, by the controller in a first register, the first delay value to program the first delay of the first programmable analog delay circuit; and b) storing, by the controller in a second register, the second delay value to program the second delay of the second programmable analog delay circuit.

In Example 16, the method of Example 15, further comprising generating, by a test pattern generator, the test bit pattern for transmission within the differential pair of signals, the test bit pattern being known to the bit error checker.

In Example 17, the method of Example 15, wherein the first programmable analog delay circuit comprises a first tapped delay line and the second programmable analog delay circuit comprises a second tapped delay line, wherein storing comprises: a) storing a first tap value for the first tapped delay line of the first programmable analog delay circuit that generates the first delay; and b) storing a second tap value for the second tapped delay line of the second programmable analog delay circuit that generates the second delay.

In Example 18, the method of Example 15, wherein the BER comprises a first BER, the method further comprising: 1) in response to the first BER being greater than the threshold BER, adding a fixed delay value to the second delay value to generate a second net delay value; 2) receiving a second BER based on use of the second net delay value; and 3) in response to a determination that the second BER is less than the threshold BER, storing the second net delay value to program the second delay of the first programmable analog delay circuit.

In Example 19, the method of Example 15, wherein the BER comprises a first BER, the method further comprising: 1) in response to the first BER being greater than the threshold BER, adding a fixed delay value to the second delay value to generate a second net delay value; 2) receiving a second BER based on use of the second net delay value; 3) in response to the second BER being less than the first BER, again adding the fixed delay value to the second delay value; and 4) in response to a determination that a third BER, which follows the second BER, is less than the threshold BER, storing the second net delay value to program the second delay of the first programmable analog delay circuit.

In Example 20, the method of Example 15, wherein the BER comprises a first BER, the method further comprising: 1) in response to the first BER being greater than the threshold BER, adding a fixed delay value to the second delay value to generate a second net delay value; 2) receiving a second BER based on use of the second net delay value; 3) in response to the second BER being greater than the first BER: a) setting the second net delay value to zero; and b) adding the fixed delay value to the first delay value to generate a first net delay value; and c) determining whether a third BER, which follows the second BER, is less than the threshold BER.

In Example 21, the method of Example 20, further comprising, in response to a determination that a third BER is greater than the threshold BER: 1) determining whether the third BER is greater than the second BER; and 2) in response to a determination that the third BER is less than the second BER, adding the fixed delay to the first net delay value.

In Example 22, the method of Example 20, further comprising, in response to a determination that the third BER is less than the threshold BER: 1) storing the first net delay value to program the first delay of the first programmable analog delay circuit; and 2) storing the second net delay value to program the second delay of the second programmable analog delay circuit.

Various embodiments can have different combinations of the structural features described above. For instance, all optional features of the computing system described above can also be implemented with respect to the method or process described herein and specifics in the examples can be used anywhere in one or more embodiments.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

The embodiments are described with reference to compression/decompression optimization in solid-state memory devices in specific integrated circuits, such as in computing platforms or microprocessors. The embodiments can also be applicable to other types of integrated circuits and programmable logic devices. For example, the disclosed embodiments are not limited to desktop computer systems or portable computers, such as the Intel® Ultrabooks™ computers, and can be also used in other devices, such as handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments can especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but can also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the below examples describe instruction handling and distribution in the context of execution units and logic circuits, other embodiments of the present disclosure can be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions can be used to cause a general-purpose or special-purpose processor that is programmed with the instructions to perform the steps of the present disclosure. Embodiments of the present disclosure can be provided as a computer program product or software which can include a machine or computer-readable medium having stored thereon instructions which can be used to program a computer (or other electronic devices) to perform one or more operations according to embodiments of the present disclosure. Alternatively, operations of embodiments of the present disclosure might be performed by specific hardware components that contain fixed-function logic for performing the operations, or by any combination of programmed computer components and fixed-function hardware components.

Instructions used to program logic to perform embodiments of the disclosure can be stored within a memory in the system, such as DRAM, cache, flash memory, or other storage. Furthermore, the instructions can be distributed via a network or by way of other computer readable media. Thus a machine-readable medium can include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design can go through various stages, from creation to simulation to fabrication. Data representing a design can represent the design in a number of manners. First, as is useful in simulations, the hardware can be represented using a hardware description language or another functional description language. Additionally, a circuit level model with logic and/or transistor gates can be produced at some stages of the design process. Furthermore, most designs, at some stage, reach a level of data representing the physical placement of various devices in the hardware model. In the case where conventional semiconductor fabrication techniques are used, the data representing the hardware model can be the data specifying the presence or absence of various features on different mask layers for masks used to produce the integrated circuit. In any representation of the design, the data can be stored in any form of a machine readable medium. A memory or a magnetic or optical storage such as a disc can be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider can store on a tangible, machine-readable medium, at least temporarily, an article, such as information encoded into a carrier wave, embodying techniques of embodiments of the present disclosure.

A module as used herein refers to a combination of hardware, software, and/or firmware. As an example, a module may include hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) can refer to the combination of the microcontroller and the non-transitory medium. Often module boundaries that are illustrated as separate commonly vary and potentially overlap. For example, a first and a second module can share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate can provide a 0 or a 1 during operation. But a logic gate 'configured to' provide an enable signal to a clock does not include every potential logic gate that can provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes a known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, can be capable of holding a single logical value or multiple logical values. However, other representations of values in computer systems have been used. For example the decimal number ten can also be represented as a binary value of 1010 and a hexadecimal letter A. Therefore, a value includes a representation of information capable of being held in a computer system.

Moreover, states can be represented by values or portions of values. As an example, a first value, such as a logical one, can represent a default or initial state, while a second value, such as a logical zero, can represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that a combination of values can be utilized to represent a number of states.

The embodiments of methods, hardware, software, firmware or code set forth above can be implemented via instructions or code stored on a machine-accessible, machine readable, computer accessible, or computer readable medium which are executable by a processing element. A non-transitory machine-accessible/readable medium includes a mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that can receive information there from.

Instructions used to program logic to perform embodiments of the disclosure can be stored within a memory in the system, such as DRAM, cache, flash memory, or other storage. Furthermore, the instructions can be distributed via a network or by way of other computer readable media. Thus a machine-readable medium can include a mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes a type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics can be combined in a suitable manner in one or more embodiments.

In the foregoing specification, a detailed description has been given with reference to specific exemplary embodiments. It will, however, be evident that various modifications and changes can be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but can refer to different and distinct embodiments, as well as potentially the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "defining," "receiving," "determining," "issuing," "linking," "associating," "obtaining," "authenticating," "prohibiting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and can not necessarily have an ordinal meaning according to their numerical designation.

What is claimed is:

1. A device comprising:
   a transmitter to transmit, to a receiver, a differential pair of signals comprising a positive signal transmitted across a positive conductor and a negative signal transmitted across a negative conductor;
   a first programmable analog delay circuit coupled to the positive conductor to provide a first delay to the positive signal;
   a second programmable analog delay circuit coupled to the negative conductor to provide a second delay to the negative signal; and
   a controller coupled to the first programmable analog delay circuit and to the second programmable analog delay circuit, the controller to:
      receive, over a transmission link with the receiver, data based on a bit error rate (BER) of the differential pair of signals as measured by a bit error checker of the receiver; and
      in response to a determination that the BER is less than a threshold BER, store a first delay value to program the first delay of the first programmable analog delay circuit and store a second delay value to program the second delay of the second programmable analog delay circuit.

2. The device of claim 1, wherein the transmitter, the positive conductor, and the negative conductor are disposed on a printed circuit board.

3. The device of claim 1, wherein the first programmable analog delay circuit comprises a first tapped delay line and the second programmable analog delay circuit comprises a second tapped delay line.

4. The device of claim 3, wherein to store the first delay value comprises to store a tap value for the first tapped delay line of the first programmable analog delay circuit that generates the first delay.

5. The device of claim 1, further comprising a test pattern generator coupled to the transmitter, the test pattern generator to generate a test bit pattern for transmission within the differential pair of signals, the test bit pattern being known to the bit error checker.

6. The device of claim 1, wherein the controller comprises a first register to store the first delay value for the first delay and a second register to store the second delay value for the second delay.

7. The device of claim 1, wherein the BER comprises a first BER, and wherein the controller is further to:
   in response to the first BER being greater than the threshold BER, add a fixed delay value to the first delay value to generate a first net delay value;
   receive, over the transmission link, a second BER based on use of the first net delay value;
   in response to the second BER being less than the first BER, add the fixed delay value to the first net delay value; and
   in response to a determination that a third BER, which follows the second BER, is less than the threshold BER, store the first net delay value to program the first delay of the first programmable analog delay circuit.

8. The device of claim 1, wherein the BER comprises a first BER, and wherein the controller is further to:
   in response to the first BER being greater than the threshold BER, add a fixed delay value to the first delay value to generate a first net delay value;
   receive, over the transmission link, a second BER based on use of the first net delay value;
   in response to the second BER being greater than the first BER:
      set the first net delay value to zero; and
      add the fixed delay value to the second delay value to generate a second net delay value; and
   in response to a determination that a third BER, which follows the second BER, is less than the threshold BER, store the first net delay value to program the first delay of the first programmable analog delay circuit and store the second net delay value to program the second delay of the second programmable analog delay circuit.

9. A system comprising:
   a test pattern generator to generate a test bit pattern;
   a receiver and a bit error checker coupled to the receiver, the bit error checker to determine a bit error rate (BER) in a received signal that carries the test bit pattern;
   a transmitter communicably coupled to the receiver and the test pattern generator, the transmitter to transmit, to the receiver, a differential pair of signals with the test bit pattern, the differential pair of signals comprising a positive signal transmitted across a positive conductor and a negative signal transmitted across a negative conductor;
   a first programmable analog delay circuit coupled to the positive conductor to provide a first delay to the positive signal;
   a second programmable analog delay circuit coupled to the negative conductor to provide a second delay to the negative signal; and
   a controller coupled to the first programmable analog delay circuit and to the second programmable analog delay circuit, the controller to:
      receive, over a transmission link with the bit error checker, data based on the BER of the differential pair of signals; and in response to a determination that the BER is less than a threshold BER, store a first delay value to program the first delay of the first programmable analog delay circuit and store a second delay value to program the second delay of the second programmable analog delay circuit.

10. The system of claim 9, wherein the controller comprises a first register to store the first delay value for the first delay and a second register to store the second delay value for the second delay.

11. The system of claim 9, wherein the first programmable analog delay circuit comprises a first tapped delay line and the second programmable analog delay circuit comprises a second tapped delay line.

12. The system of claim 11, wherein to store the first delay value comprises to store a first tap value for the first tapped delay line that generates the first delay, and wherein to store the second delay value comprises to store a second tap value for the second tapped delay line that generates the second delay.

13. The system of claim 11, wherein the BER comprises a first BER, and wherein the controller is further to:
in response to the first BER being greater than the threshold BER, add a fixed delay value to the first delay value to generate a first net delay value;
receive, over the transmission link, a second BER based on use of the first net delay value;
in response to the second BER being less than the first BER, add the fixed delay value to the first net delay value; and
in response to a determination that a third BER, which follows the second BER, is less than the threshold BER:
determine a tap value corresponding to the first net delay value; and
signal the first tapped delay line with the tap value to generate the first delay on the positive conductor.

14. The system of claim 11, wherein the BER comprises a first BER, and wherein the controller is further to:
in response to the first BER being greater than the threshold BER, add a fixed delay value to the first delay value to generate a first net delay value;
receive, over the transmission link, a second BER based on use of the first net delay value;
in response to the second BER being greater than the first BER:
set the first net delay value to zero; and
add the fixed delay value to the second delay value to generate a second net delay value; and
in response to a determination that a third BER, which follows the second BER, is less than the threshold BER:
determine a tap value corresponding to the second net delay value; and
signal the second tapped delay line with the tap value to generate the second net delay on the negative conductor.

15. A method comprising:
resetting, by a controller, a first delay value for a positive signal and a second delay value for a negative signal of a differential pair of signals;
transmitting, by a transmitter to a receiver, the differential pair of signals comprising the positive signal transmitted across a positive conductor and the negative signal transmitted across a negative conductor, wherein the differential pair of signals including a test bit pattern;
receiving, from a bit error checker of the receiver, data based on a bit error rate (BER) of the test bit pattern in the differential pair of signals, as received by the receiver;
determining, by a controller coupled to a first programmable analog delay circuit of the positive conductor and to a second programmable analog delay circuit of the negative conductor, whether the BER is less than a threshold BER; and
in response to determining that the BER is less than the threshold BER:
storing, by the controller in a first register, the first delay value to program the first delay of the first programmable analog delay circuit; and
storing, by the controller in a second register, the second delay value to program the second delay of the second programmable analog delay circuit.

16. The method of claim 15, further comprising generating, by a test pattern generator, the test bit pattern for transmission within the differential pair of signals, the test bit pattern being known to the bit error checker.

17. The method of claim 15, wherein the first programmable analog delay circuit comprises a first tapped delay line and the second programmable analog delay circuit comprises a second tapped delay line, wherein storing comprises:
storing a first tap value for the first tapped delay line of the first programmable analog delay circuit that generates the first delay; and
storing a second tap value for the second tapped delay line of the second programmable analog delay circuit that generates the second delay.

18. The method of claim 15, wherein the BER comprises a first BER, the method further comprising:
in response to the first BER being greater than the threshold BER, adding a fixed delay value to the second delay value to generate a second net delay value;
receiving a second BER based on use of the second net delay value; and
in response to a determination that the second BER is less than the threshold BER, storing the second net delay value to program the second delay of the first programmable analog delay circuit.

19. The method of claim 15, wherein the BER comprises a first BER, the method further comprising:
in response to the first BER being greater than the threshold BER, adding a fixed delay value to the second delay value to generate a second net delay value;
receiving a second BER based on use of the second net delay value;
in response to the second BER being less than the first BER, again adding the fixed delay value to the second delay value; and
in response to a determination that a third BER, which follows the second BER, is less than the threshold BER, storing the second net delay value to program the second delay of the first programmable analog delay circuit.

20. The method of claim 15, wherein the BER comprises a first BER, the method further comprising:
in response to the first BER being greater than the threshold BER, adding a fixed delay value to the second delay value to generate a second net delay value;
receiving a second BER based on use of the second net delay value;
in response to the second BER being greater than the first BER:

setting the second net delay value to zero; and
adding the fixed delay value to the first delay value to generate a first net delay value; and determining whether a third BER, which follows the second BER, is less than the threshold BER.

21. The method of claim 20, further comprising, in response to a determination that a third BER is greater than the threshold BER:

determining whether the third BER is greater than the second BER; and in response to a determination that the third BER is less than the second BER, adding the fixed delay value to the first net delay value.

22. The method of claim 20, further comprising, in response to a determination that the third BER is less than the threshold BER:

storing the first net delay value to program the first delay of the first programmable analog delay circuit; and storing the second net delay value to program the second delay of the second programmable analog delay circuit.

* * * * *